United States Patent [19]

Yamaguchi et al.

[11] 4,238,848
[45] Dec. 9, 1980

[54] ELECTRONIC TIMEPIECE

[75] Inventors: Isao Yamaguchi, Ome; Heiji Hashizume, Higashimurayama, both of Japan; Akira Nakazawa, Balmain East, Australia; Hirosige Sugihara, Kokubunji, Japan

[73] Assignee: Hitachi, Ltd., Japan

[21] Appl. No.: 760,123

[22] Filed: Jan. 17, 1977

[30] Foreign Application Priority Data

Jan. 20, 1976 [JP] Japan .................................. 51-4646

[51] Int. Cl.³ .............................................. G04B 37/00
[52] U.S. Cl. ...................................... 368/276; 368/287
[58] Field of Search ................ 58/23 R, 23 BA, 50 R, 58/88 R, 90 R

[56] References Cited

U.S. PATENT DOCUMENTS

| 3,672,155 | 6/1972  | Bergey et al.       | 58/50 R  |
| 3,800,525 | 4/1974  | Bergey              | 58/50 R  |
| 3,861,135 | 1/1975  | Seeger, Jr. et al.  | 58/50 R  |
| 3,863,436 | 2/1975  | Schwarzschild et al.| 58/50 R  |
| 3,945,196 | 3/1976  | Wood et al.         | 58/50 R  |
| 3,969,887 | 7/1976  | Fukumoto            | 58/50 R  |
| 3,977,176 | 8/1976  | Murakami et al.     | 58/23 BA |
| 3,983,689 | 10/1976 | Burke et al.        | 58/50 R  |

OTHER PUBLICATIONS

Schweizer Uhren- und Schmuch Journal, 1975, Nr. 2, pp. 236-237.

*Primary Examiner*—Vit W. Miska
*Attorney, Agent, or Firm*—Craig & Antonelli

[57] ABSTRACT

An electronic timepiece comprising a module structure, the module structure comprising circuit board means including a plurality of circuit boards, display means having a display panel disposed on one surface and input terminals disposed on the other surface, resilient connector means having resiliency and conductivity, and an assembling casing for assembling the circuit board means, the display means and the resilient connector means. The resilient connector means affords the electric interconnection of said plurality of circuit boards and said display means and prevents damage of the module structure by shocks.

11 Claims, 64 Drawing Figures

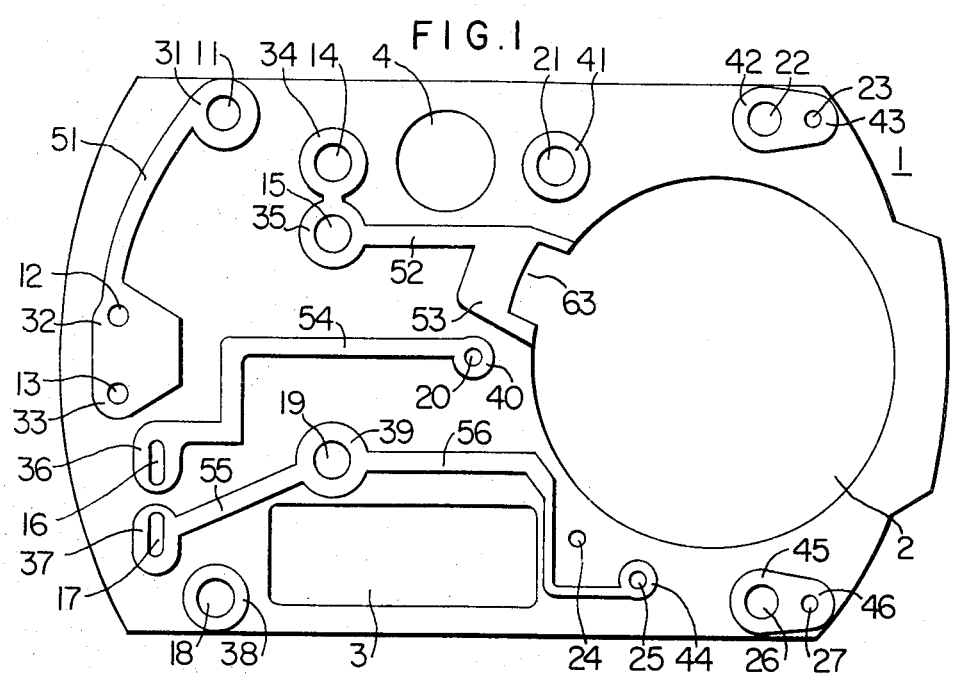
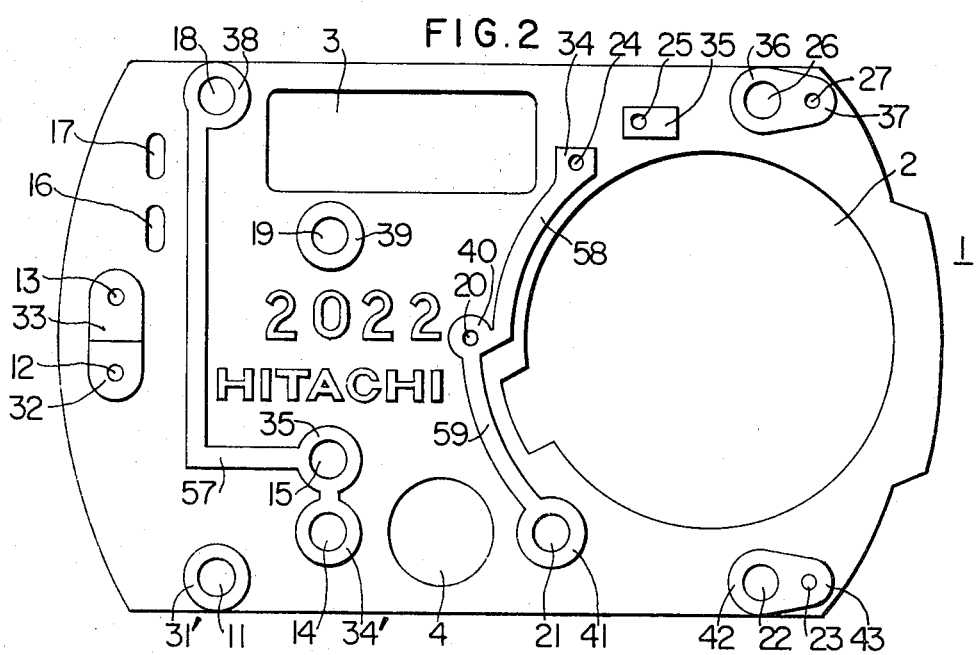

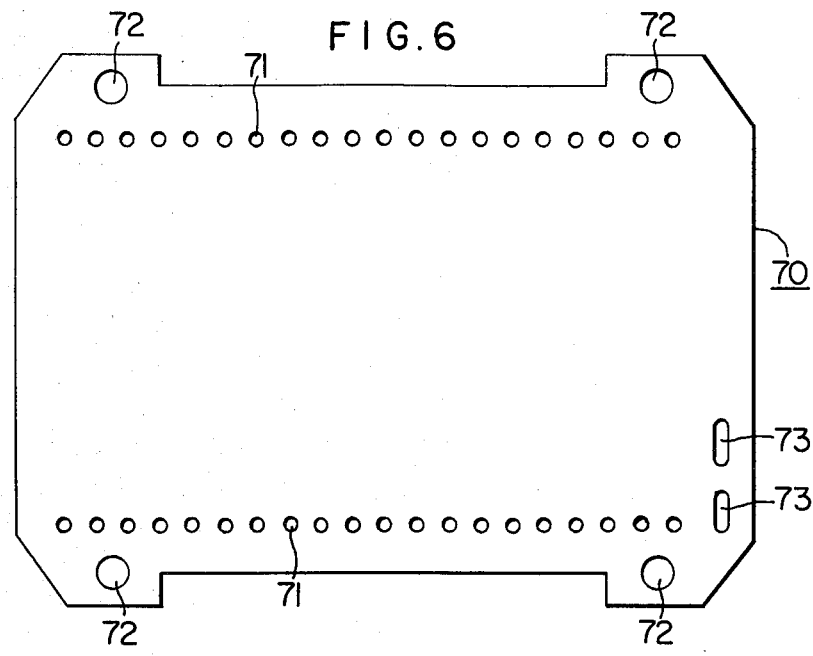
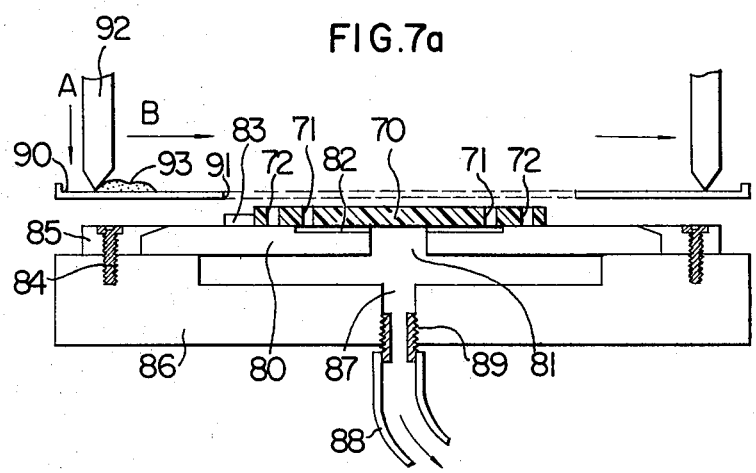
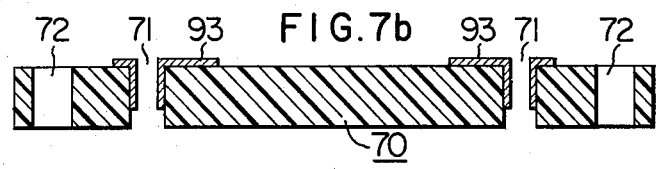

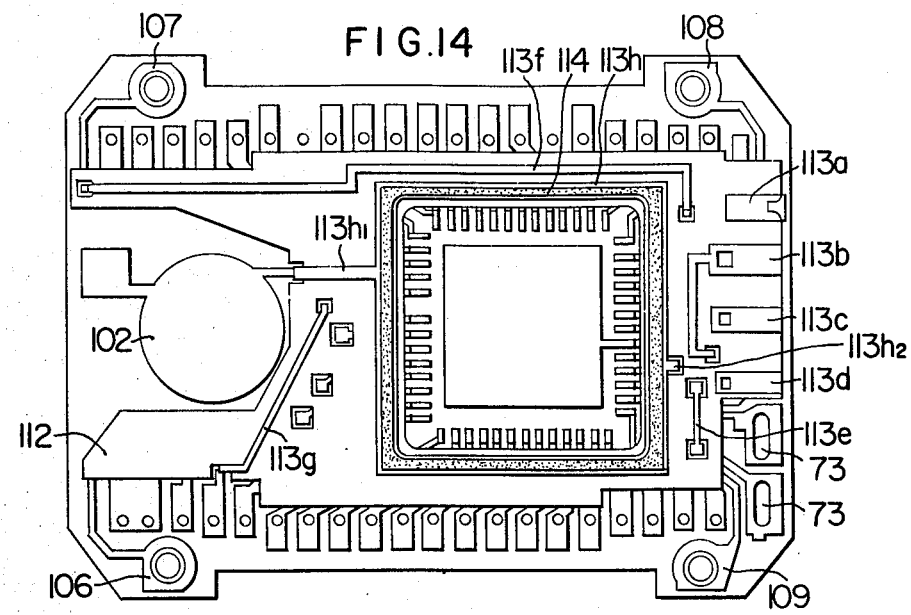
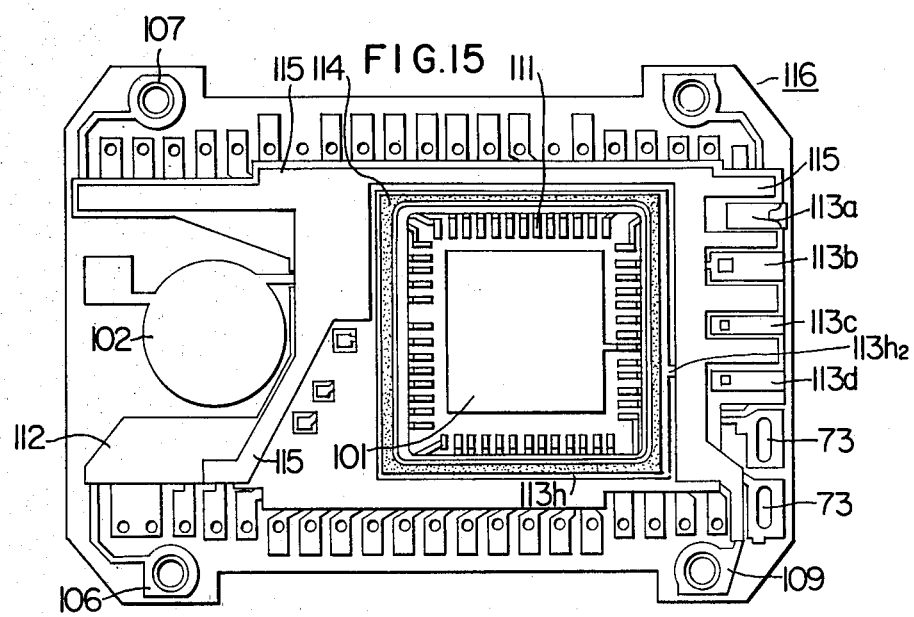

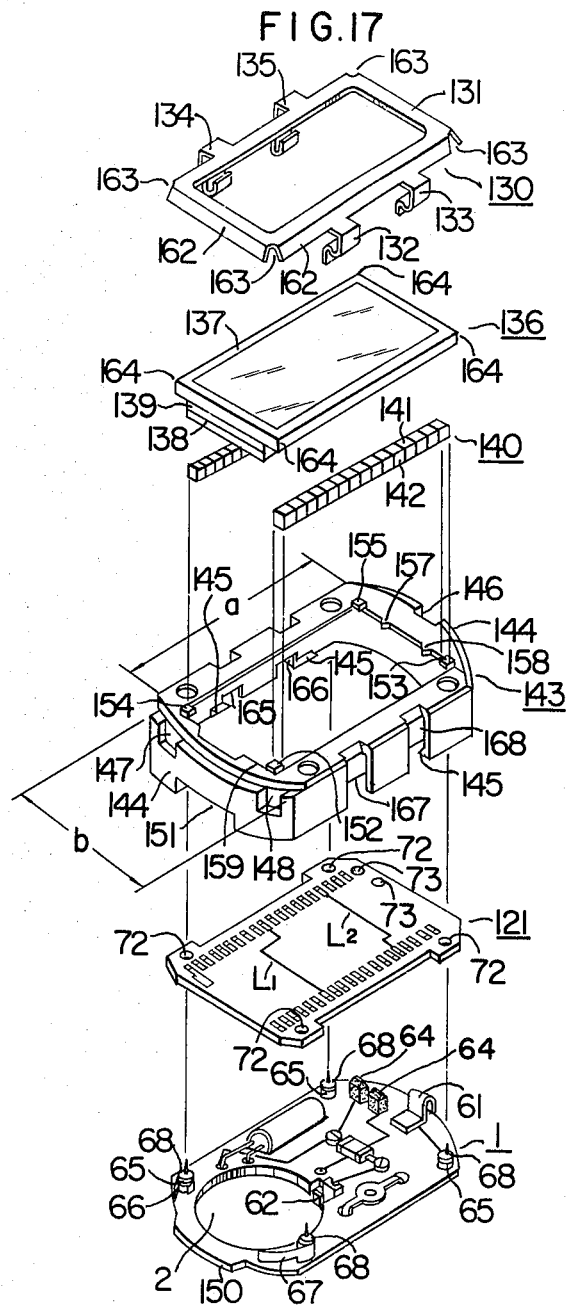

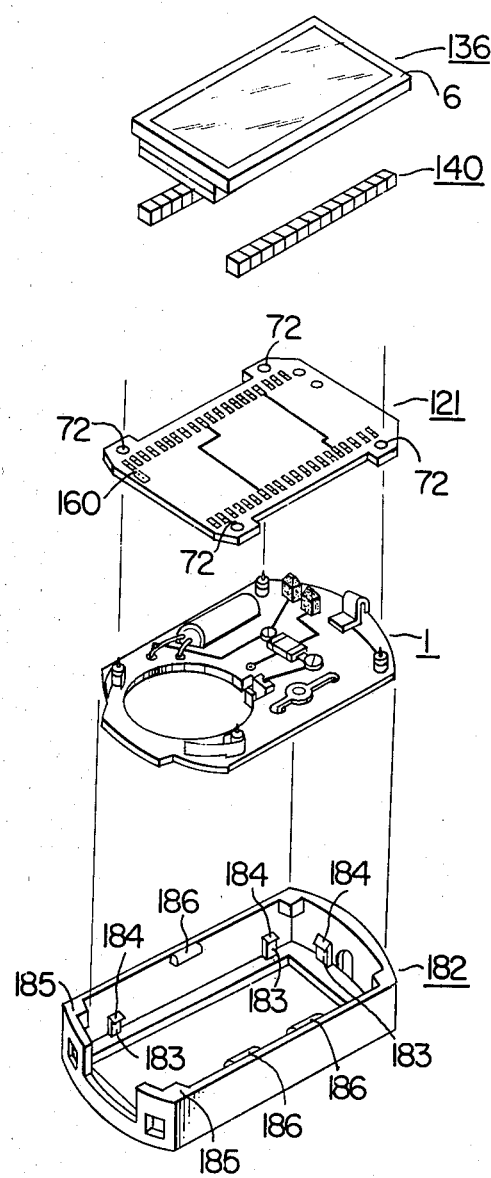

FIG.40
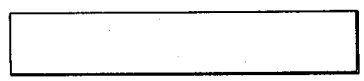
FIG.38  FIG.35  FIG.39
 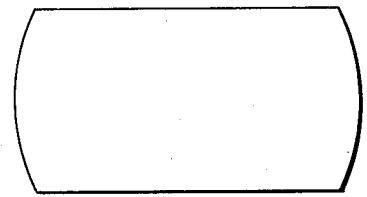 
FIG.36
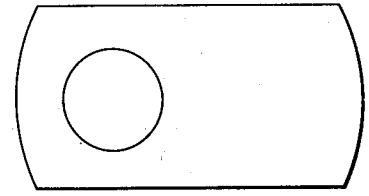
FIG.37
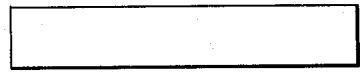

FIG.43
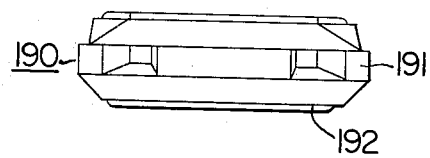
FIG.45   FIG.41   FIG.44
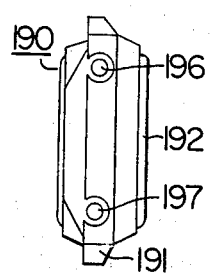 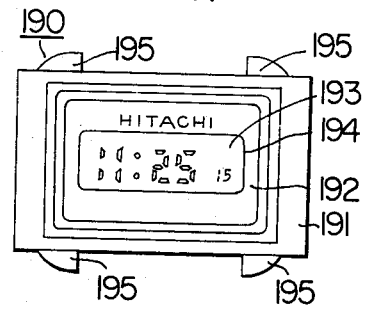 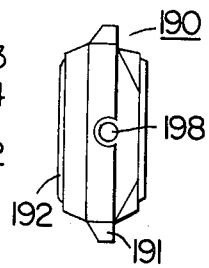
FIG.42
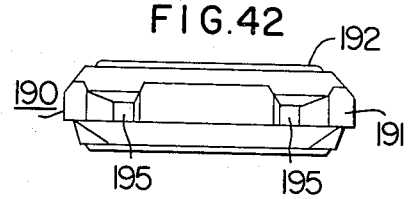
FIG.46
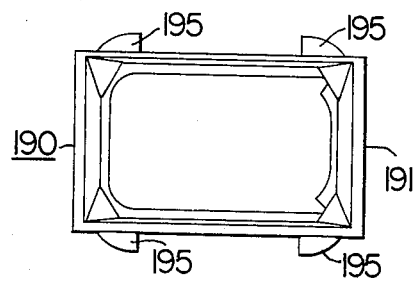

ELECTRONIC TIMEPIECE

BACKGROUND OF THE INVENTION

1. Field of the Invention

This invention relates to an electronic device and more particularly to the structure and assembly of an electronic digital wristwatch.

2. Description of the Prior Art

The electronic digital wristwatch is powered by a small size battery such as a silver oxide battery and includes at least frequency divider means for dividing the frequency of a constant frequency signal derived from an oscillator circuit utilizing a crystal oscillator, counter circuit means for counting the output signal of the frequency divider means, decoder circuit means for decoding the output signal of the counter circuit means, and driver means for driving digital display means for visually displaying the time therein by the output signal of the decoder circuit means.

In such a small-sized electronic timepiece, simplification of the assembly of the so-called module in which is assembled the circuit elements of the electronic timepiece has been one of the main problems. Another of the main problems lies in how the occupation space of a module, particularly the thickness of the module, can be reduced. This is mainly for the purpose of reducing the thickness of the wristwatch as thin as possible. Further, from the point of mass-productivity, the geometric shape of the module to be installed in the outer casing of a timepiece should be commonly adaptable to various designs of the outer casing. Particularly in digital type timepiece, the shape of the outer casing is not limited to the disk shape which has been the fundamental shape for the wristwatches of both the digital and the hands display types. Various novel shapes may be adopted for the outer casing. Therefore, the module or the assembly of the circuit boards to be loaded in the outer casing should be so designed to be adaptable to various conventional and novel designs of the outer casing. Further, the shape of the module should be so designed that various variations in the shape of the digital display and in the display characters of the digital timepiece will necessitate only minor changes in part of the blocks or the circuit boards of the module. Further, the module to be loaded in an outer casing should be divided into an appropriate group of blocks or circuit boards from the point of easy assembly. Inappropriate block division of the module will complicate the assembling steps and gives undesirable results with respect to the above-described problems. Since the main part of the electronic circuit in the blocks or the circuit boards constituting the module is formed of a semiconductor pellet or pellets manufactured by IC techniques, the structure of the blocks or the circuit boards of the module assembly should be so designed as to enhance the adaptation of semiconductor IC techniques. Namely, the wiring in the blocks or circuit boards to which the semiconductor pellet is to be loaded or mounted should be so designed as to enhance the applicability of the semiconductor IC techniques. Further, the module of a timepiece should be shock-proof.

SUMMARY OF THE INVENTION

Therfore, an object of this invention is to provide a structure of an electronic timepiece which is easy to assemble.

Another object of this invention is to provide a method of easily assembling an electronic timepiece.

Further object of this invention is to provide a method of packaging a plurality of circuit boards in a small space with high density.

Another object of this invention is to provide a geometric shape of the module embodying the timepiece circuit adaptable to a wide range of variations in the outer casing of a timepiece.

Another object of this invention is to provide a module structure to be loaded in an outer casing of a timepiece, enabling easy assembly of a plurality of constituent unit circuit boards or blocks into the module.

Another object of this invention is to provide an easy method of assembling a module to be loaded in a timepiece.

Another object of this invention is to provide a shock-proof module structure.

Another object of this invention is to provide a module structure for an electronic timepiece enabling simplification in the mutual electrical wiring of unit circuit boards constituting the module.

Another object of this invention is to provide a method of manufacturing a circuit board on which circuit elements and wiring of a timepiece circuit are to be mounted.

Another object of this invention is to provide a structure of a circuit board formed of a wired ceramic substrate, etc. adaptable to a wide range of semiconductor integrated circuits.

Another object of this invention is to provide a method of manufacturing the circuit board of the preceding object.

Another object of this invention is to provide a novel structure of an outer casing of a timepiece in which a module is to be packaged.

According to an aspect of this invention, there is provided a module assembling a timepiece circuit and a display device therein, comprising a display means such as a liquid crystal display, a layered wiring means assembling a timepiece circuit and an assembly casing or module casing for fixing the display means and the layered wiring means at predetermined positions. The loading of the display means and the layered wiring means to the assembly casing is achieved by the utilization of the resilient force of a resilient member formed of conductive rubber, etc. and used as a spacer member and an electrical wiring connector member disposed between the display means and the layered wiring means so as to utilize the compressing force of the resilient member to a support member such as arms provided in the assembly casing. This arrangement simplifies the assembly of the module by the elimination of the hand works such as soldering, screw fixing, etc. The layered wiring means may be divided into two wiring boards. In a preferred embodiment, a first wiring board consists of a printed wiring board having one principal surface loaded with relatively large circuit components for constituting a timepiece circuit. These circuit components may be so-called external circuit components such as a crystal oscillator, capacitors in an oscillator circuit, etc. which are difficult to assemble in an IC chip by semiconductor IC techniques. A second wiring board consists of a ceramic wiring board. On a first principal surface of the ceramic wiring board, is loaded a semiconductor integrated circuit chip integrating an active circuit element of the oscillator circuit, a frequency divider circuit, a counter circuit, a decoder circuit, and a driver circuit. The wiring for the IC chip is provided in the same surface of this ceramic wiring board. On the second principal surface of the ceramic wiring board, output wiring terminals of the driver circuit are provided. These terminals are connected to the wiring layers on the first principal surface via through-holes provided in the ceramic board. The wiring in this ceramic wiring board may be also manufactured by the semiconductor IC techniques similar to the IC chip. A spacing support member formed at least partially of resilient member is provided between the first and the second wiring boards. The assembly is loaded in the assembling casing utilizing this resilient force. The resilient support member is used also as a wiring connector for the mutual connection of the first and the second wiring boards. Further, the use of this resilient support member prevents shock damage of the wiring boards such as a ceramic board due to accidental dropping of the timepiece. The output wiring terminals on the second principal surface of the second wiring board formed of a ceramic plate are electrically connected to the input wiring terminals on the second principal surface of the liquid crystal display board through said resilient connector member. Here, since the input terminals of the liquid crystal display board and the output terminals of the second wiring board are disposed on parallel surfaces facing against to each other, alternations in the pattern of the input terminals of the display board due to changes in the shape of the display board or in the pattern of the display will necessitate only the corresponding alternations in the pattern of the output terminals in the second wiring board. Therefore, alternations in the design for a variety of the display boards can be simplified.

A typical plane shape of the module is defined by two parallel lines corresponding to the two long sides of a rectangle and two arcs corresponding to part of a circle circumscribing the rectangle. The plane shape of the module may be also rectangular, elliptic, or of kinds of elongated shape such as a modified ellipsoid. This module shape is adapted for assembly in a novel elliptic outer casing and for compatible use in a conventionally used circular casing. Thus, the module shape of this invention is adapted for wide variations of the outer casing, such as circular, rectangular, elliptic, etc.

Semiconductor integrated circuit techniques are employed in the formation of the wiring layers on a ceramic board used as a layered wiring means and in the mounting and sealing of an IC chip on the wiring layers. Further, novel semiconductor integrated circuit techniques as described later are employed for mounting and sealing the IC chip on the ceramic board.

Further objects, features and advantages of this invention will become apparent in the following description of the preferred embodiments when taken in conjunction with the accompanying drawings.

BRIEF DESCRIPTION OF THE DRAWINGS

FIGS. 1 and 2 are a front and a back plan view of a printed wiring board to be used in the module of an electronic timepiece according to this invention, respectively.

FIG. 6 is a front plan view of a ceramic substrate for forming the second wiring board.

FIGS. 7a and 7b are side cross-sections of the ceramic substrate; FIG. 7a shows how metallized wiring layers are printed on the ceramic substrate in a silk screen printing apparatus and FIG. 7b shows how the side surfaces of through holes are coated with metallized paste layers.

FIGS. 11 and 13 to 15 are front plan views of the ceramic substrate showing how wiring layers and insulating layers are formed on the ceramic substrate, respectively.

FIG. 17 is an assembly drawing of an embodiment of a module according to an embodiment of this invention.

FIG. 34 is an assembly drawing of a module according to another embodiment of this invention.

FIGS. 35 to 40 are schematic diagrams showing the external shape in various directions of an outer casing of an electronic watch according to an embodiment of this invention.

FIGS. 41 to 46 are a front plan view, a lower side view, an upper side view, a right side view, a left side view, and a back plan view of a wristwatch body according to another embodiment of this invention, respectively.

DESCRIPTION OF THE PREFERRED EMBODIMENTS

Figure 3:
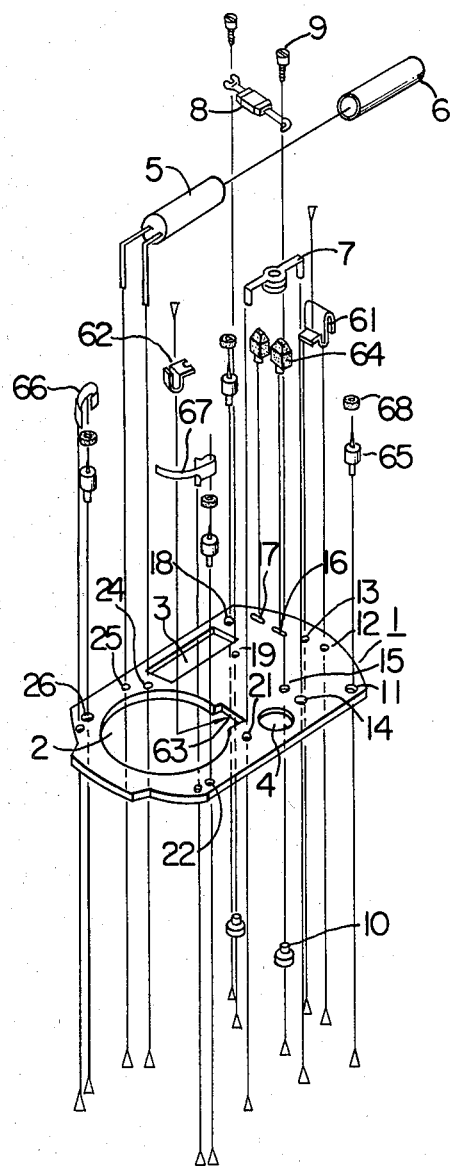
FIG. 3 is an assembly drawing of various circuit components to the printed wiring board of FIGS. 1 and 2.
Figure 4:
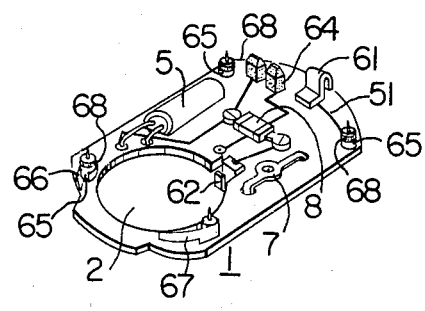
FIG. 4 is a perspective view of the finished printed wiring board.

FIGS. 1 to 4 show a printed wiring board which constitutes the first wiring board of the module of a timepiece. FIGS. 1 and 2 show the patterns on the front and the back surfaces of a wiring board before the mount of circuit components such as a crystal oscillator. FIG. 3 shows the spatial relationship of the wiring board and the circuit components to be assembled on the wiring board board. FIG. 4 shows a front perspective view of the wiring board assembled with the circuit components.

In FIG. 1, a printed wiring board 1 is formed of one of the generally known printed wiring board. Metal wirings of a predetermined pattern are formed on the surfaces thereof. As shown in the figure, the wiring board 1 has an elliptic shape. Through-holes 11 to 27 are formed at predetermined positions in the wiring board 1. On the surfaces around the respective through-holes, metallized layers are formed by the printing techniques. Solder layers 31 to 46 are formed on the surfaces of the metallized layers around the through-holes. Metal wirings 51 to 56 are formed between the predetermined pairs of the through-holes. A circular hole 2 is formed at an end portion of the board 1 for mounting a battery which serves as a driving power source of an LSI element mounted on a ceramic wiring board, i.e. a second wiring board. A rectangular hole 3 is formed along the horizontal (longitudinal) direction of the board for mounting a crystal oscillator. Another circular hole 4 is formed in the wiring board 1 for mounting a capacitor of the oscillator circuit.

FIG. 2 shows the back view of the wiring board 1, in which similar reference numerals to those in FIG. 1 show similar parts. Metal wirings 57 to 59 are also formed on this back surface for connecting predetermined pairs of the through-holes. The metal wirings 51 to 59 are preferably coated with insulating films for protecting (passivating) the surface from the ambient atmosphere.

Circuit components are mounted on the surface of the printed wiring board 1 by soldering. FIG. 3 shows the mutual assembly relations of the printed wiring board and the circuit components. The printed wiring board 1 has the wiring pattern shown in FIG. 1 and the circuit components are attached to the predetermined positions of the wiring board. A crystal oscillator 5 has a cylindrical cap inserted in an insulating tube 6 and loaded in the hole 3 in the wiring board 1. The oscillator 5 has two leads bent and inserted in the respective through-holes 24 and 25 and soldered by the solder layers 34 and 35. In the figure, triangle marks Δ shown in the bottom portion indicate the portions to be soldered. A capacitor 7 of the oscillator circuit is inserted in the hole 4. Two leads derived from the both ends of the capacitor 7 are inserted in the through-holes 14 and 21 of the wiring board 1 and soldered at the solder layers 34 and 41. A temperature compensating capacitor 8 has two leads extending from the both ends and fixed on the solder layers 35 and 39 at the through-holes 15 and 19 with screws 9. Nuts 10 are embedded at predetermined positions in the back surface of the wiring board 1.

A first switch contact 61 is soldered to the through-holes 12 and 13 of the board 1 by the solder layers 32 and 33. A battery contact 62 is soldered at a recessed portion 63 formed in part of the hole 2 with the solder layer 53. A pair of rectangular piller 64 formed of conducting rubber is inserted into the through-holes 16 and 17 of the board 1. This pair of connectors serves to supply the electric signal generated in the crystal oscillator to a predetermined input terminal of the LSI element. The projecting portions to be inserted into the through-holes 16 and 17 has an elliptic cross-section with the longer axis oriented in the direction connecting the pair of connectors to be hardly bent in this direction so that the short-circuiting of the two connectors is prevented. Further, the projecting tips have vertical acute angles of about 60° and 40° so that even when there occurs some positional displacement in the assembling step they can be set smoothly. Connector pins 65 are soldered to the through-holes 11, 18, 22 and 26 provided at the four corners of the board 1. Here, the second and the third switch contacts 66 and 67 wound around the two pins adjacent to the hole 2 and soldered simultaneously. The switch contacts 66 and 67 can be very easily positioned in this way and sufficiently firmly fixed to the board by the simultaneous soldering at each one point. Among the three switch contacts 61, 66 and 67, the first contact 61 is for exchanging the display of time and date (time-date exchanging switch) in the display surface of the timepiece, the second contact 66 is for resetting only the display of seconds to zero (second-display resetting switch) and the third contact 67 is for adjusting the advance or the delay of time display (time adjusting switch). Rubber washer connectors 68 are inserted on the respective connector pins 65. These rubber connectors are used in assembling the first wiring board in the casing together with the ceramic wiring board.

FIG. 4 shows a front perspective view of the printed wiring board assembled on the basis of the positional relationship as described above.

Figure 5:
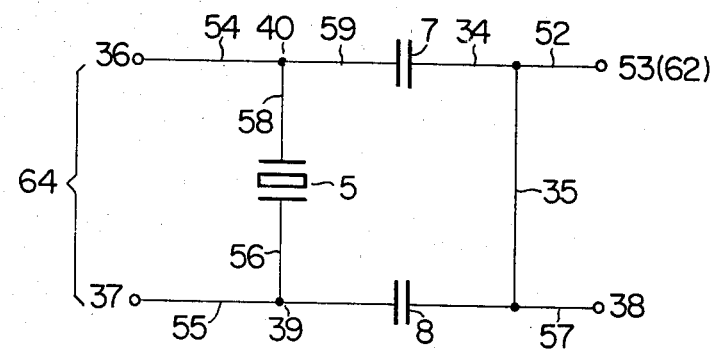
FIG. 5 is an equivalent circuit diagram of the circuit formed on the printed wiring board.
Figure 8:
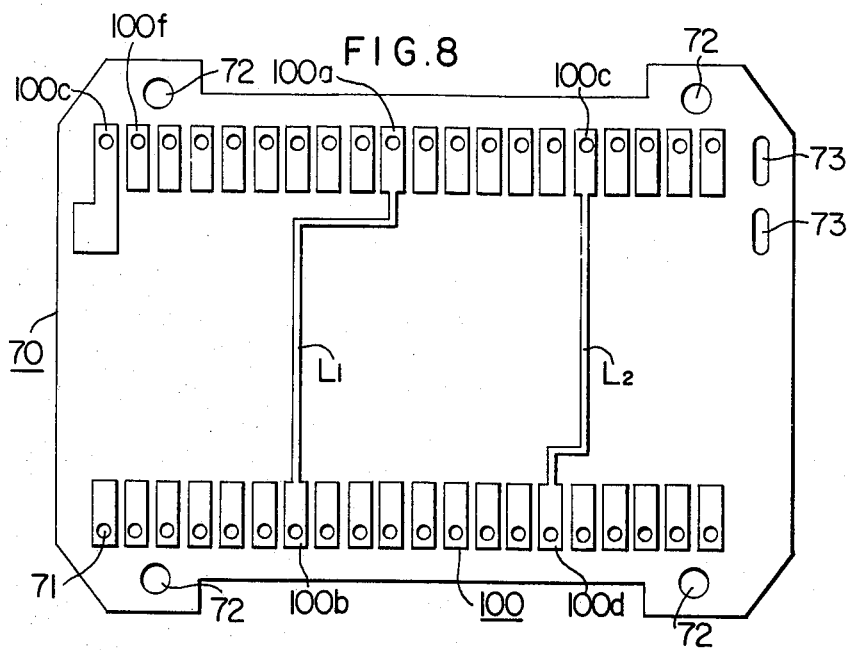
FIGS. 8 and 9 are a back and a front plan views of the ceramic substrate printed with metallized wiring layers, respectively.

FIG. 5 shows an equivalent circuit of the oscillator circuit constituting the main part of the printed wiring board 1 assembled as in FIG. 4. Similar numerals to those in FIGS. 1 to 4 indicate similar parts.

The printed wiring board assembled in the above manner will be assembled in an outer casing together with a ceramic wiring board assembled in the separate assembling steps integratedly to serve as a timepiece module.

The manufacture of the ceramic wiring board will be described next and description follows on the method of mounting and sealing a frequency dividing circuit for counting and frequency-dividing the fixed frequency signal derived from the crystal oscillator circuit, a decoder circuit for decoding the output signal of the frequency divider circuit, a silicon large scale integrated circuit (LSI) chip embodying a driver circuit for driving a liquid crystal display (LCD) device by the output signal of the decoder circuit, a booster circuit for boosting the supply voltage, etc., and two boosting capacitors to be used in the booster circuit to the ceramic wiring board.

First, the manufacture of the ceramic wiring board will be described. A ceramic substrate 70 as shown in FIG. 6 is prepared. Alumina ($Al_2O_3$) powder of a grain diameter of about 2 to 3 μm which constitute the main component of the ceramic substrate 70 and binder, e.g. polyvinylalcohol, are mixed at a ratio of 96:4 by weight %. This mixed powder is shaped into a rectangular board of about 0.8 mm (thickness)×23 mm (length)×17 mm (width) by the dry press shaping method. Then, the shaped substrate is sintered at about 1500° to 1600° C. for several hours. The rectangular shape of the ceramic substrate constitutes one of the features of this invention, since it enables to give considerable effects in handling of the ceramic substrate in the manufacture of the ceramic wiring board and in handling of the ceramic wiring board in mounting and sealing the LSI and the boosting capacitors thereon. For example, when metallized wirings are to be formed on the ceramic substrate by silk screening, the ceramic substrate can be easily and accurately positioned and fixed on the silk screen printing mount utilizing the right angle formed by a long side and a short side of the ceramic substrate. Thus, the positional accuracy of the wirings can be increased. Further, in mounting the LSI and the boosting capacitor on the wired substrate, the ceramic substrate can be easily and accurately positioned and fixed to a jig utilizing said right angle. Thus, the mounting accuracy can be improved. Also the wire bonding accuracy between the mounted LSI and the bonding pads of the metallized wirings can be extremely improved. Therefore, the operation efficiency and the yield can be increased. Yet further, along with the basic principle of the rectangular display of the digital display electronic wristwatch, is provided an electronic watch of a compact outer shape with extremely high area utilization requiring no excess space than the display portion. These effects obtained by shaping the ceramic wiring board in a rectangular shape cannot at least be expected in those utilizing a circular ceramic wiring board as in the conventional digital display electronic wristwatches.

In the ceramic substrate 70, through-holes 71 and 72 are formed along the two long sides and through-holes 73 are formed along one short side. Each through-hole 71 has a diameter of 0.5 mm and is provided for performing electric connection between metallized wiring layers formed on the front surface of the ceramic substrate 70 for deriving the electrodes of the LSI and metallized wiring layers formed on the back surface of the ceramic substrate 70 for the connection with the LCD. Through-holes 72 serve to connect the wirings formed on the printed wiring board 1 for adjusting hours, minutes, seconds and dates with metallized wiring layers for deriving the electrodes of the LSI through the conducting rubber connectors. The through-holes 73 serve to connect the wirings for deriving the electrodes of the crystal oscillator assembled in the printed circuit board 1 with the metallized wiring layers for deriving the electrodes of the LSI through the conducting rubber connectors. In this way, the soldering of circuit components to the ceramic substrate 70 can be eliminated by providing through-holes 71, 72 and 73 in the ceramic substrate 70. Therefore, the operation of connecting the circuit components can be simplified while raising the reliability of the connections.

Before the formation of the metallized wirings on the ceramic substrate 70, the substrate 70 is ultrasonically cleaned in trichloroethylene, aceton, alcohol, etc. to remove dirt and other impurities adhering on the substrate and to sufficiently degrease the substrate.

Regarding the metallized wirings, those for connecting the LCD are first formed on the back surface of the ceramic substrate and those on the front surface are formed thereafter. As shown in FIG. 7a, the metallized wirings may be formed by screen printing. A surface of the ceramic substrate 70 is sucked onto a surface plate 80 by vacuum suction. Thus suction may be achieved by the utilization of a suction hole 81 formed in the surface plate 80. Further, a paste sucking hole 82 is provided in the surface plate for sucking and coating metallizing paste on the side surfaces of the through-holes 71. A guide member 83 is provided on the surface plate 80 for accurately positioning the ceramic substrate 70. The surface plate 80 is positioned and fixed on a screen mount 86 by fixing hooks 85 through bolts 84. Part of the plane of the screen mount 86 for fixing the surface plate 80 is recessed and the vacuum suction hole 87 is formed thereat. A suction pipe 88 connects a suction pump (not shown) and the suction hole 87 through a joint 89. A screen printing plate 90 carries a silk screen 91 in which a masking pattern is formed in correspondence with the desired wiring pattern. Metallized paste 93 placed on the screen printing plate is transferred onto the silk screen by a squee-gee 92 to print the ceramic substrate 70 with the paste.

The ceramic substrate 70 is sucked on the surface plate 80. The metallized paste 93, for example a paste material formed of palladium and silver, is placed on the screen printing plate 90. While sucking with a suction pump, the squee-gee 92 is depressed onto the screen printing plate 90 as shown by arrow A and moved thereon from one side to the other as shown by arrow B. The silk screen 91 is brought into contact with the ceramic substrate 70 by the squee-gee 93 and the metallized paste is printed on the ceramic substrate 70 through the silk screen 91. The metallized paste printed onto the through-holes 71 is sucked downward and thereby coats the side surfaces of the through-holes 71. In this embodiment, the metallized paste is arranged to coat the side surfaces of the through-holes 71 and 73 to 60 to 90% of the whole depth in this metallizing printing on the back surface. Then, in the metallizing printing on the front surface, it is arranged to coat the side surfaces of the through-holes from the front surface to a depth 60 to 90% of the whole depth with the metallized paste to overlap the two metallized wiring layers and hence to insure the electric conduction. More particularly, the moving speed of the squee-gee was selected at 5 to 15 cm/sec, the viscosity of the paste was adjusted at 20 to $40 \times 10^4$ cps at 25° C. and the sucking force of the suction pump was adjusted to coat the paste on the through-holes to 60 to 90% depth. In this way, since the coating of the metallized paste on the side surfaces of the through-holes is controlled to cover 60 to 90% of the whole depth, the penetration of the paste from one surface to the other through the through-holes can be completely prevented to provide wirings of high reliability free of short-circuiting between the wirings. It will be apparent that this method will exhibit the effect more and more as the number of wirings increases more and can be adapted for the general case of forming wiring layers on the both surfaces of an insulating substrate and achieving electric conducting therebetween as well as for the wiring on a ceramic substrate for a timepiece circuit.

The ceramic substrate 70 subjected to the metallizing paste printing on the rear surface is heated at 120° C. for 10 minutes to dry the paste and sintered at about 760° C. Thus, is formed a metallized wiring pattern including a plurality of rectangular metallized wiring layers 100 formed around the respective through-holes along the long sides of the substrate and two wiring layers $L_1$ and $L_2$ connecting the metallized layers 100a and 100b, and the layers 100c and 100d. The wiring layers 100a and 100c are to be connected with the metallized wiring layers 100a' and 100c' formed on the front surface of the substrate for deriving the electrodes of the LSI, while there is no metallized wiring layer for deriving the electrodes of the LSI on the front surface of the substrate in the portions corresponding to the wiring layers 100b and 100d so that the wiring layers 100b and 100d are not connected with the LSI. The provision of the wiring layers $L_1$ and $L_2$ is for simplifying the electric connection for driving the LCD. Namely in the second digit display of minutes and seconds (0 to 5) in the LCD, the uppermost and the lowermost segments among the B-like segments are turned on (0, 2, 3, 5) and off (1, 4) in common. It is useless to provide separate output terminals from the LSI for driving these segments. Thus, only the common lead terminals 100a'-100a and 100c'-100c are derived from the LSi and connected also to the terminals 100b and 100d through the wirings $L_1$ and $L_2$ for supplying the output signals to the respective segment terminals of the LCD. The wirings $L_1$ and $L_2$ are used for the display of minutes and seconds, respectively.

The wiring layers 100e and 100f are to be connected to the common terminals of the segments in the LCD for displaying hours, minutes and seconds, short-circuited on the front surface of the substrate by the metallized wiring layer 100g and connected to the LSI. The top portion of the wiring layer 100e forms an electrode for measuring the frequency after the assembly.

Figure 9:
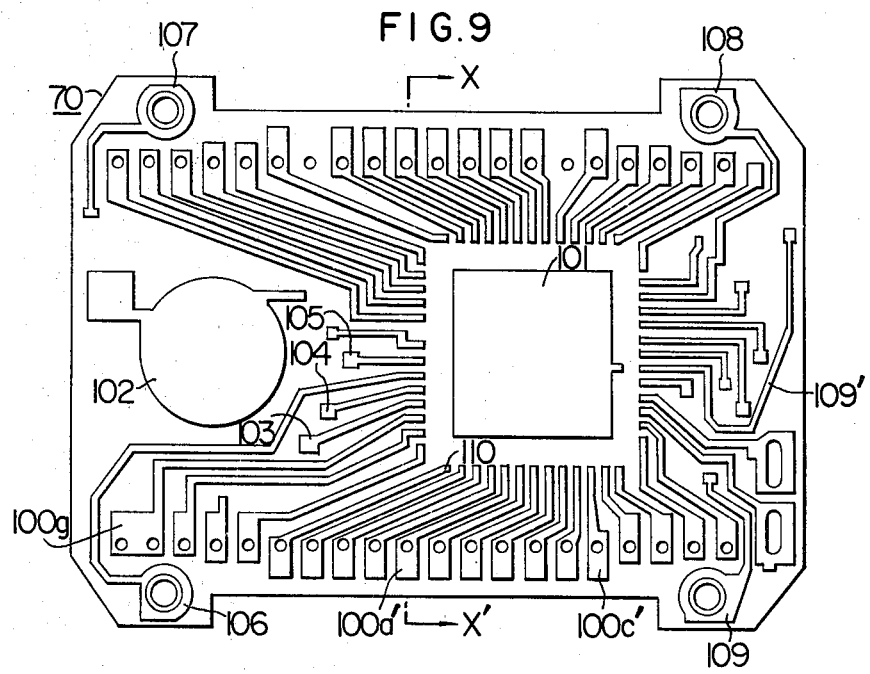

Next, metallized wirings are formed on the front surface of the ceramic substrate. First metallized wiring layers having a predetermined pattern as shown in FIG. 9 are formed on the front surface of the ceramic substrate by the silk screen printing method described in conjunction with FIG. 7 using metallized paste consisting of palladium and silver in a similar manner to the formation of the metallized wirings on the back surface. In FIG. 9, numeral 101 indicates a square metallized layer for mounting the LSI, 102 a circular metallized layer for contacting one electrode, e.g. the negative electrode, of a miniature battery such as a silver oxide battery, 103, 104 and 105 testing proves for the LSI, 106 a metallized wiring to be connected with the switch contact 66 on the printed wiring board for resetting only the display of seconds, 107 a metallized wiring to be connected with the switch contact 67 on the printed wiring board for adjusting time, 108 a metallized wiring to be connected with the switch contact 61 on the printed wiring board for exchanging the display of time and date, and 109 a metallized wiring connected with the ground terminal 109' of the LSI through a metallized wiring on the back surface and to be connected with the wiring layer on the printed wiring board for contacting the positive electrode of the silver oxide battery and with the switch contact 62 through the conducting rubber.

Figure 10:
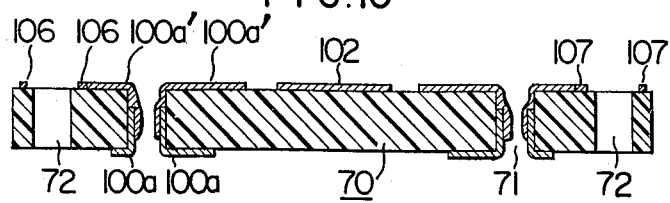
FIG. 10 is a side cross-section of the ceramic substrate showing how the metallized layers from the two surfaces overlap each other on the side surfaces of the through holes.

By the achievement of the metallizing step on the front surface of the ceramic substrate, the metallized wiring layers on the side surfaces of the through-holes from the front and the back surfaces overlap each other as shown in FIG. 10 to establish electric conduction as described above. FIG. 10 shows a cross-section along the line X–X' in FIG. 9.

Figure 11:
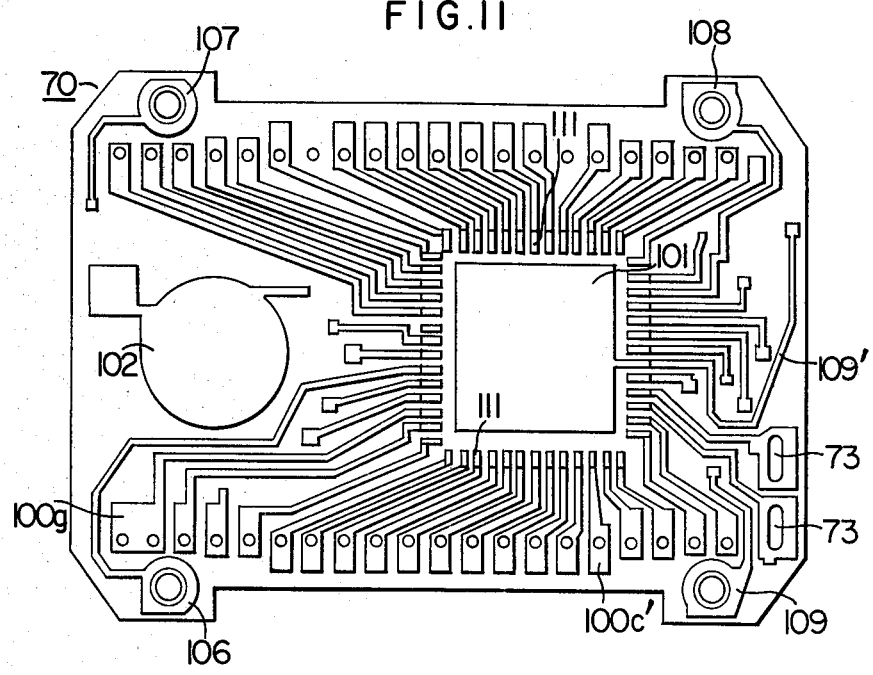

Next, gold-metallized paste layers 111 for wire-bonding with aluminium or gold wires are formed by screen-printing at the tip portions 110 of the first metallized wiring layers extending to the neighborhood of the metallized layers 101 for mounting the LSI so as to partially overlap thereon as shown in FIG. 11. The gold metallized layer is formed by screen-printing the gold metallized paste including copper and sintering the printed paste in the common sintering step for sintering glass paste for forming the first insulating glass layer to be achieved later. In the present embodiment, the gold metallized paste contained 0.5 weight % of copper and did not contain glass sleet which is usually used in forming gold metallized layers on a ceramic substrate for increasing the adhesion of the gold metallized layers to the ceramic substrate. When glass is mixed in the paste, it is dispersed on the surface of the metallized layers and hence the connection strength of the wire-bonding becomes worse. The thickness of the gold metallized layer was $7 \pm 2$ μm.

It is preferable to control the content of copper in the gold metallized paste at 0.4 to 0.8 weight % and the thickness of the gold metallized layer at 5 to 9 μm. The reason of these regions will be described below.

When gold metallized paste containing copper is printed and sintered to form a gold metallized layer on a ceramic substrate, it is considered that copper included in the paste will be oxidized in the sintering process and give contribution to the adhesion of the metallized layer to the substrate. In this embodiment, the gold metallized layer should be subjected to a plurality of heat treatments in the whole manufacturing processes including sintering steps required in the formation of the second metallized wiring layers and of insulating glass layers between the wiring layers. Thus, the surface of the gold metallized layer may be blackened. Then, when an aluminum or gold wire is bonded thereto, the bonding strength cannot be sufficiently high. The present inventors have studied this phenomenon from various aspects and found that a certain amount of copper included in the gold paste is oxidized and gives contribution to the adhesion with the ceramic substrate, but the excess copper is not oxidized and dispersedly remains in the metallized layer, and by the succeeding heat treatments precipitates on the surface of the gold metallized layer, is oxidized and blackened. Further, it was found that this phenomenon is particularly noticeable when the gold metallized layer is re-heated below 900° C. Then, the aluminium or gold wire will be bonded to the oxidized copper layer precipitated on the gold metallized layer. Since this copper oxide is mechanically weak, the bonding strength cannot be strong enough. Examining these results, the following methods may be considered for solving the above problem. Namely, (1) the gold metallized layer should not be heat-treated below 900° C. after the initial formation, or (2) some expedients should be provided for preventing the precipitation of copper even when the gold metallized layer is heat-treated below 900° C. after the initial formation. The first method is not achievable when a ceramic wiring substrate is manufactured with the use of different kinds of metallized paste and different kinds of paste material such as insulating glass paste which have different sintering temperatures from that of the gold paste. According to the second method, it was found that the above problem can be solved by controlling the copper content in the gold paste and the thickness of the coated metallized layer in appropriate ranges.

Figure 12:
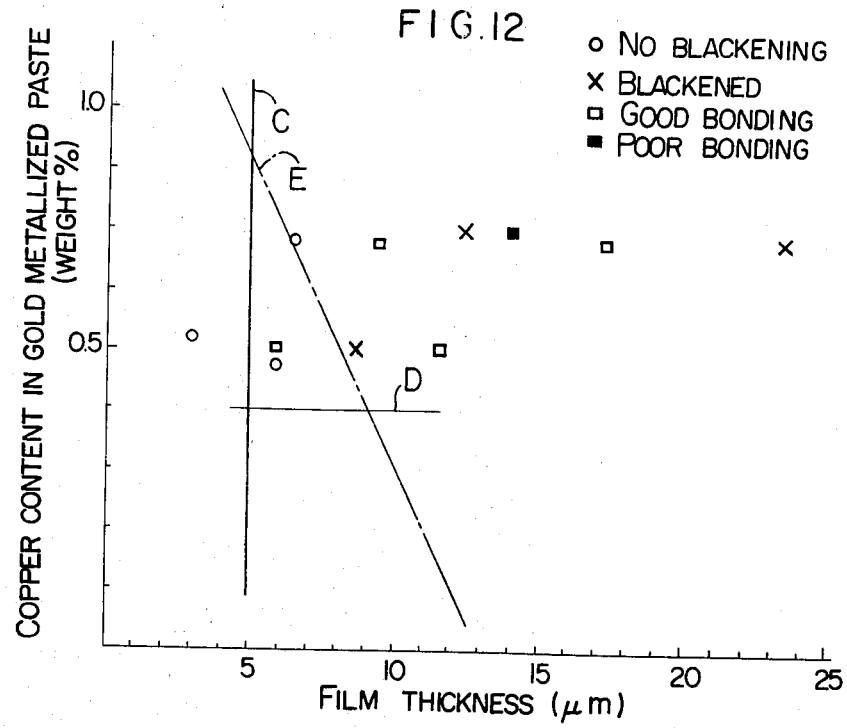
FIG. 12 is a graph showing the experimental results of blackening and bonding strength of the gold metallized layer subjected to several heat treatments.

FIG. 12 shows the experimental results on the relation of the blackening phenonemon and the bonding strength with respect to the variations in the copper content (weight %) in the gold metallized paste and the thickness of the gold metallized layer formed of gold paste. The metallized layer is subjected to successive re-heating treatments at 900° C. once, at 780° C. twice and at 530° C. once. In the figure, the abscissa represents the thickness of the gold metallized layer and the ordinate represents the copper content in the gold metallized paste. Solid line C indicates the practical lower limit of the film thickness required for the bonding and solid line D represents the practical lower limit of the adhesion strength between the gold metallized layer and the ceramic substrate. As is apparent from the figure, dotted broken line E is obtained as the border line for the copper content and the film thickness of the gold metallized layer for satisfying both the blackening phenomenon and the bonding strength. Namely, the triangular area defined by the three lines C, D and E defines a preferred ranges of the copper content and the film thickness for preventing blackening and enables bonding of sufficient strength. In other words, when the copper content in the gold metallized paste is selected in the range of 0.4 to 0.8 weight % and the thickness of the gold metallized layer in the range of 5 to 9 μm, the surface of the gold metallized layer is never blackened even by the repeated heat treatments below 900° C. and an aluminum or gold wire can be bonded to the gold metallized layer with sufficient bonding strength. It will be apparent that this method of forming a gold metallized layer for bonding on a ceramic substrate characterized by using gold metallized paste containing 0.4 to 0.8 weight % of copper and forming a gold metallized layer having a thickness of 5 to 9 μm is not limited for the manufacture of a ceramic wired board for timepieces but can be widely adaptable for forming gold metallized layers for bonding on ceramic substrates.

Figure 13:
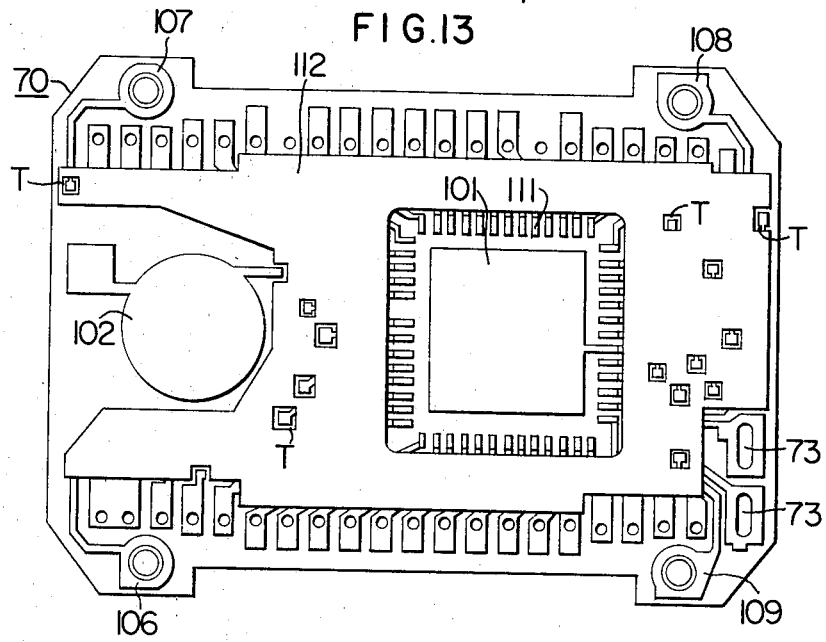

After the gold metallized layer 111 is printed, heated and dried at 120° C. for ten minutes, an insulating glass layer 112 is formed on the first surface except a plurality of through-holes T as shown in FIG. 13. This insulating glass layer may be formed of crystallized glass of BaO—Al$_2$O$_3$—SiO$_2$ system or CaO—Al$_2$O$_3$—SiO$_2$ system. From the points of adhesion to the metallized wiring layers and of denseness of the glass layer itself, it is preferable to use crystallized glass of CaO—Al$_2$O$_3$—SiO$_2$ system. The formation of this insulating glass layer 112 is divided into two stages. This division is for the purpose of accurately forming fine through-holes of 0.4 mm square and of eliminating pin holes in the glass layer. For this purpose, the mixing ratio of glass and vehicle was selected at 70:30 by weight % and the viscosity was arranged to $\eta = 25 \times 10^4$ cps (at 25° C.). After the first insulating glass paste 112a is screen-printed, dried at 125° C. for fine minutes to volatilize thinner in the paste, and sintered at 900° C. for ten minutes in air to form the first insulating glass layer. In this heat treatment, the gold metallized paste is inevitably subjected to similar heat treatment simultaneously. Then, the same insulating glass paste as above is printed on the first insulating glass layer except the through-holes by the screen printing, and dried to form the second insulating glass paste layer 112b. Thereafter, metallized paste consistng of palladium and silver is printed, heated and dried at 125° C. for five minutes, and then sintered at 900° C. for ten minutes to form the second metallized wiring layers 113 as shown in FIG. 14. The second insulating glass paste layer 112b is simultaneously sintered in this sintering process. The metallized wiring layers 113a, 113b, 113c and 113d serve to connect the boosting capacitors thereto. The wiring layer 113e connects the ground terminal 109' of the LSI with the wiring 109, and the wiring 113f connects the wiring layer 107 connected to the switch contact for adjusting time with the LSI. The wiring 113g is a crossed wiring layer for connecting with the segment terminal of the LCD, and the wiring layer 113h is for mounting a sealing Kovar metal cap and has one end 113h$_1$ connected with the metallized wiring 102 for connecting the negative electrode of the silver oxide battery and the other end connected with the metallized wiring for supplying power to the LSI.

Since the second insulating glass paste is sintered together in the sintering step for the second metallized wirings, the low melting point glass contained in the second metallized wiring layer and the crystallized glass in the second insulating glass paste are fused and strongly adhered to each other. If the second insulating glass layer is sintered first and then the second metallized layer is sintered (individual sintering), such strong adhesion as described above cannot be obtained. While the simultaneous sintering can increase the adhesion between the second insulating glass paste and the second metallized wiring layers greatly, the surface of the metallized wiring layers not covered by the glass layer becomes to give glassy luster by the precipitation of the glass and hence soldering thereat becomes difficult. For solving this problem and enabling easy and strong soldering with the sealing cap formed of Kovar, etc., a third metallized paste of palladium and silver is printed only at the portion for mounting the sealing cap, dried at 125° C. for five minutes and sintered at 780° to 800° C. to form a sealing metallized layer 114. This third metallized paste should preferably have good soldering properties, for example palladium-silver paste #9061 of Du Pont may be used.

Thereafter, low melting point glass, for example glass paste #8185 of Du Pont, is printed, dried at 125° C. for five minutes and sintered at 530° C. for one to five minutes to form a passivating glass layer 115 as shown in FIG. 15. Then, a ceramic wiring board 116 having desired metallized wiring layers is provided.

Then, description will be made of the assembly and sealing of the LSI and the boosting capacitors on the finished ceramic wiring board 116.

Figure 16A:
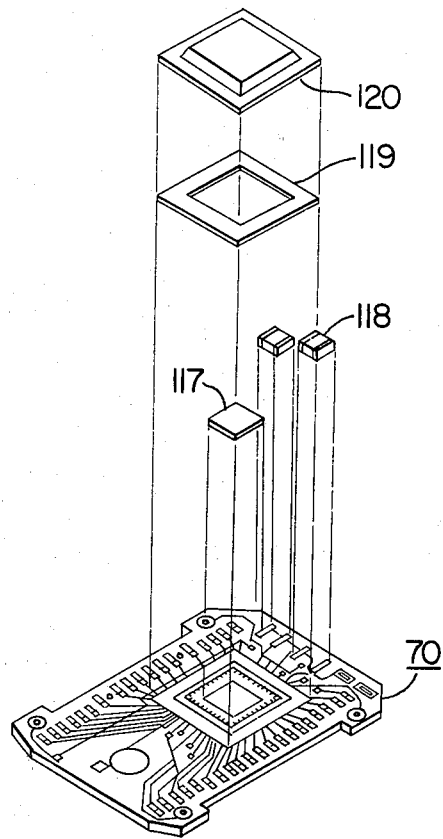
FIG. 16a is an assembly drawing of a ceramic wiring board and FIG. 16b is a perspective view of the assembled ceramic wiring board.

On the metallized wiring layers 101, 113a, 113b, 113c and 113d for mounting the LSI and the boosting capacitors, silver paste is printed and then the LSI chip 117 and a pair of the boosting capacitors 118 are mounted thereon as shown in FIG. 16a. Then, the mounted ceramic board is heated at 125° C. for two hours to fixedly mount the LSI chip 117 and the capacitors 118 at predetermined positions.

Then, the electrode terminals of the LSI are connected with the gold metallized bonding pads with aluminium or gold wires by bonding.

Figure 16B:
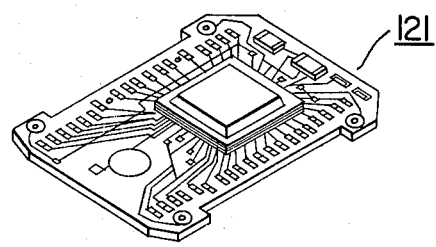

Then, a sheet 119 formed of tin solder containing 5 to 10 weight % of gold is placed on the sealing metallized layer 114 of the ceramic wiring board and a sealing cap 120 formed of gold or tin plated Kovar glass is placed thereon. Subjecting the assembly to heat treatment at 230° to 260° C. in nitrogen atmosphere, is provided a ceramic package 121 assembling and sealing the LSI and the boosting capacitors as shown in FIG. 16b. Here, when a gold plated Kovar glass cap is used, the filament structure in the Au-Sn solder can be reduced by using a cap having a plated gold layer of a thickness of 1 to 2 μm and sintered at 500° to 600° C. for 30 to 60 minutes in hydrogen atmosphere.

The ceramic wiring board 121 sealing the LSI chip and a printed wiring board 1 mounted with external circuit components, such as crystal oscillator, oscillating capacitor, temperature compensating capacitor, etc., which are difficult to integrate in the LSI chip are loaded in an assembling casing (referred to as module casing hereafter). Hereinbelow, description will be made on the assembling method of loading the ceramic wiring board and the printed wiring board in the module casing and mounting an LCD board on this module casing to form a module in connection with the assembly drawing shown in FIG. 17. Here, the term "module" represents a circuit structure having a finished timepiece circuit to be loaded in an outer casing of a timepiece.

In FIG. 17, numeral 130 indicates a metal support plate called fitting support or engaging support of the LCD board, formed of a resilient metal plate of 0.5 mm thick and consisting of a frame 131 provided with a window in correspondence to the digits display portion of the LCD board and four engaging hooks 132, 133, 134 and 135. An LCD board 136 of generally known field effect mode is a substantially rectangular plate and includes an upper glass plate 137, a lower glass plate 138 and a glass frame 139 for establishing a space for containing a liquid crystal material. On the back surface of the upper glass plate 137, B or 8-shaped segments for displaying digits of hours, minutes and seconds and terminals connected with the segments are formed of transparent conductive films called nesa film. The lower glass plate 138 is smaller than the upper glass plate 137, is provided with a nesa film for forming the common electrode against the segment electrodes on the upper glass plate and is disposed below the upper glass plate through the glass frame 139. Zebra connectors 140 are formed of rubber strips or bars, each being formed of a laminate of conducting rubber regions 141 and insulating rubber regions 142 laminated alternately. The name "zebra" comes from the fact that the conducting rubber 141 is black and the insulating rubber 142 is white so that the alternating laminate of these rubbers gives a pattern resembling to that of the zebra. These zebra connectors 140 electrically connect the segment terminals of the LCD board 136, i.e. input wiring terminals for introducing the input electric signals, and the output wiring terminals of the ceramic board. A module casing 143 is formed of a thermo-plastic resin material and has an elastic property. Representing the longitudinal (horizontal in the figure) length a and the transverse (perpendicular to the sheet in the figure) length b, the outer shape of this module casing 143 is defined by the two long sides of a rectangle represented by $a \geq b$ and two arcs of a circle 144 circumscribing the rectangle. Such an outer shape enables the extension of the design region of the timepiece casing to be usable in a variety of designs and the simplification of the packaging of the LCD board 136 and the zebra connectors 140 in the module casing 143. Further, the thickness of the module casing 143 in the longitudinal direction is made thin i.e. 0.3 mm, so that the aperture of the module casing may be easily enlarged in inserting the printed wiring board. On the other hand, the thickness in the transverse direction is made thick, i.e. 1 mm, for enforcing the strength. The ceramic wiring board 121 is formed by the above processes and the rear surface is shown in the figure. The printed wiring board 1 is formed by the above processes.

Next, description will be made on the packaging of the fitting plate 130 for the LCD board, the LCD board 136, the zebra connectors 140, the module casing 143, the ceramic wiring board 121 and the printed wiring board 1.

(1) The ceramic wiring board is set in the module casing 143 and then the printed wiring board 1 is fitted in the module casing 143. Here, the printed wiring board 1 is fixed by the four stopper arms 145 having a width of 1.8 mm and a length of 1 mm and projecting inward (one arm being hidden and not seen in the figure). The printed wiring board 1 is disposed in the module casing 143 so that the first, second and third switch contacts 61, 66 and 67 are viewed from holes 146, 147 and 148 provided at the side portions in the longitudinal direction of the module casing 143, respectively. The first, second and third switch contacts 61, 66 and 67 are actuated through these holes 146, 147 and 148 by adjust buttons provided on the outer casing of the wristwatch.

Figure 18:
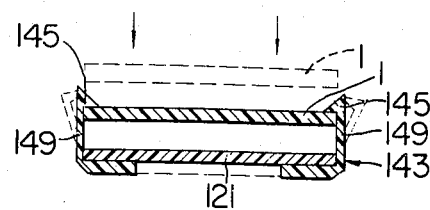
FIGS. 18 to 20 are partial cross-sections showing how the module of FIG. 17 is assembled.

The manner how the printed wiring board 1 is fixed in the module casing is shown in FIG. 18. As shown in the figure, the printed wiring board 1 is guided along the slope of the arms 145 provided to the module casing 143. As described before, the module casing 143 has some resiliency and also the side walls 149 of the casing 143 has a reduced thickness of 0.3 mm so that the arms 145 are widened or brought apart by pressing the printed wiring board 1 against the module casing 143. When the printed wiring board 1 is completely pushed into the module casing 143, the arms 145 return to the initial positions and firmly fixes the printed wiring board 1 in the module casing 143. While the printed wiring board 1 is fixed in the module casing 143, the ceramic wiring board 121 is also fixed between the casing 143 and the printed wiring board 1 with a predetermined gap maintained between the ceramic board 121 and the printed board 1 by the conducting rubber washer connectors 68 of O-ring-like shape and the connector pins 65, as shown in FIG. 17.

Positioning or registering of the ceramic wiring board 121 with respect to the printed wiring board 1 is achieved by inserting the projecting tips of the connector pins 65 and the square connectors 64 of the printed wiring board 1 into the through-holes 72 and 73 provided in the ceramic wiring board 121. Here, even when the ceramic wiring board 121 and the printed wiring board 1 are positionally offset to some extent, the projections of the connector pins 65 and the square connectors 64 are naturally set into the through-holes 72 and 73 of the ceramic board 121 by simply pushing the printed board 1 to the ceramic board 121 since the projections have tapered tips.

The printed wiring board 1 can be easily positioned with respect to the module casing 143 simply by registering the projection 150 of the printed board 1 with the cut-away 151 in the module casing 143. When the printed wiring board 1 is pushed into the module casing 143, it becomes perfectly fixed in the module casing by the four arms 145 of the module casing 143.

In mounting the ceramic package 121 and the printed wiring board 1 into the module casing 143, electrical connection is established only by the pressed contact by the use of the conducting rubber square connectors 64 and the conducting rubber washer connectors 68. Therefore, the division of the printed wiring board 1 and the ceramic wiring board 121 makes possible to enhance the easiness of the assembly while eliminating the troublesome soldering. This structure provides further advantages that the dispersion in the thickness of the parts (in this case the thicknesses of the ceramic board 121 and the printed board 1) in manufacture is tolerated and adjusted and that the shock-proof property is greatly improved. Further, the printed wiring board 1 is pressed and firmly fixed to the four arms 145 by the restoring force of the rubber. The use of the module casing 143 as described above eliminates the necessity of screw-fixing the ceramic board 121 to the printed board 1 so that the assembling process is greatly simplified. It also provides protection for the ceramic board 121 and the printed board 1 so that no special care is needed for handling the assembly and the assembly-line operation can be enhanced.

The whole circuit is loaded in the module casing by the above processes. Next, the LCD plate which forms the display of the timepiece will be packaged.

(2) One zebra connector 140 is fitted between the projections 152 and 153 having a height of 0.2 mm provided on the module casing 143. Also the other zebra connector 140 is fitted between the similar projections 154 and 155.

The length of the zebra connectors 140 is selected to be somewhat longer than the distance between the projections 152 and 153 or 154 and 155. Since the zebra connectors 140 are formed of elastic rubber material, they can be fixed at the positions by contracting the length and fitting between the projections.

Figure 19:
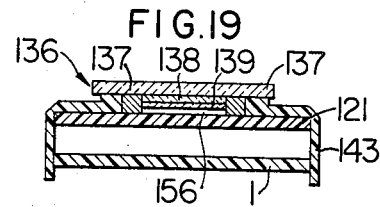

(3) Then, the LCD board 136 is fitted in the module casing 143. When the LCD board 136 is fitted, the four corners of the back surface of the upper glass plate 137 of the LCD board 136 are supported by the projections 142, 153, 154 and 155 and a space 156 is formed between the LCD board 136 and the ceramic wiring board 121 so as to prevent the short-circuiting between the wirings $L_1$ and $L_2$ on the back surface of the ceramic board 121 and a metal mirror layer (not shown) formed on the lower surface of the lower glass plate 138 of the LCD board 136 (see FIG. 19). When the LCD board 136 is fitted in the module casing, it is positioned at the designed position with the side surface of the lower glass plate 138 depressed to the standard surface 159 of the module casing 143 by the use of projections 157 and 158 of a width 0.3 mm and a height 0.3 mm provided in the module casing 143 so that the LCD board cannot move in the longitudinal direction a shown in FIG. 17. Particularly, these projections 157 and 158 have a wedge shape as shown in the figure and may be flattened by the inserted LCD board. Therefore, the LCD board 136 can be reliably positioned and fixed even when there are some errors in the dimensions of the lower glass plate 138 of the LCD 136. If the projecting wedges 157 and 158 are eliminated, the LCD board tends to be allowed to move so that the connection between the terminals of the ceramic package 121 and those of the LCD board 136 becomes inaccurate and the possibility of displaying erroneous digits becomes large.

Figure 20:
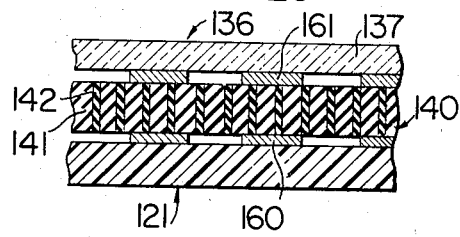

The spatial relation and hence the electrical connection of the LCD board 136, the zebra connector 140 and the ceramic board 121 is as shown in FIG. 20. As seen in the figure, the number of the conducting rubber portions 141 in the zebra connector is larger than those of the terminals 160 of the ceramic board 121 and of the terminals 161 of nesa films of the LCD board 136. Here, the nesa terminals 161 are transparent but is shown clearly for illustrating the mutual relation.

The conducting rubber portions 141 are disposed parallel to each other, sandwiching the insulating rubber portions 142. As the positions of the terminals of the ceramic boards 121 and those of the LCD board 136 are precisely determined by the module casing 143, the electrical connection therebetween is achieved reliably by the zebra connectors 140. Further, since the zebra connectors 140 are formed of elastic rubber, the connection between each pair of terminals can hardly be broken by external shocks to insure steady connection.

(4) Finally, the LCD board 136 is mounted on the module casing 143 by the restraining frame 130. The restraining frame 130 includes stop members 162 for stopping the movement of the LCD board and also for protecting the upper edges of the upper glass plate 137 of the LCD board 136 from damage. Here, the corners 163 of the frame 130 are cut away to prevent damage of the corners 164 of the upper glass plate 137 by the frame 130.

For mounting the LCD board 136 to the module casing 143, the hooks 134 and 135 of the frame 130 are engaged with the cut-away portions 165 and 166 of the module casing 143. Then, the hooks 132 and 133 are engaged with the cut-away portions 167 and 168 of the module casing 143 to perfectly fix the frame 130 itself and not to allow movements. Here, the hooks 132 and 133 are formed in S-shape for making the disassembly easy. The liquid crystal display generally has a limited service life and hence requires exchange. The exchange of the LCD 136 can be carried out by anyone in the above structure.

Figure 21:
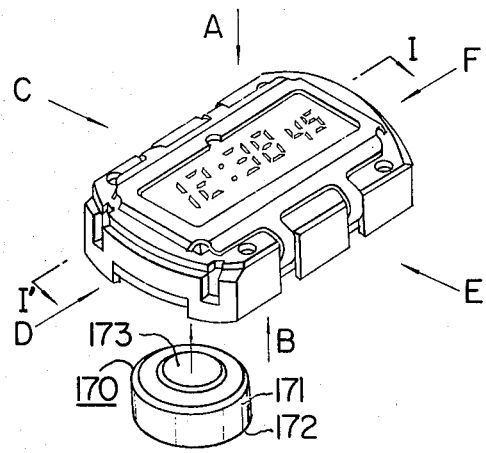
FIG. 21 is a perspective view of the assembled module.

A wristwatch module is completed in the above manner. Such a complete module 169 is shown in FIG. 21. A silver oxide battery 170 is loaded in such a module 169. The side wall 171 and the bottom surface 172 of this silver oxide battery 170 constitutes the positive electrode and the somewhat projecting portion 173 in the upper surface thereof constitutes the negative electrode. The battery 170 is pushed into the hole 2 provided in the printed wiring board 1 as shown in FIGS. 3 and 4, and the transverse play is eliminated by the battery contact 62 of U-shaped spring serving as a battery stopper and as an electrode contact. Further, in the vertical direction, a spring of the outer casing (not shown) supports the bottom portion 172 and pushes the battery upward to force the projecting portion 173 of the negative electrode make contact with the battery connecting metallized layer 102 of the ceramic wiring board 121 shown in FIG. 16. As a result, a predetermined biasing voltage is applied between the selected segments and the common electrode in the LCD to control the liquid crystal material between the selected segments and the common electrode by the electric field. Thereby, lights from the outside are absorbed in the biased region, which appears darker than the other portions and is visible to the human eye. In this way, time, e.g. 12 hours 38 minutes 45 seconds, is displayed in the LCD board as shown in FIG. 21. Here, when the battery is not loaded, the display surface of the LCD board appears totally white and no display is made since the segment electrodes are formed of transparent electrodes.

Figure 24:
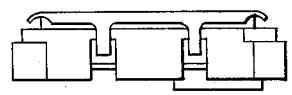
FIGS. 22 to 27 are front plan view, back plan view, upper side view, left side view, lower side view and right side view of the assembled module of FIG. 21, respectively.
Figure 25:
Figure 22:
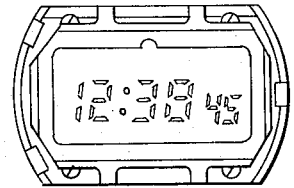
Figure 27:
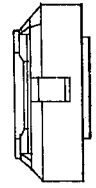
Figure 23:
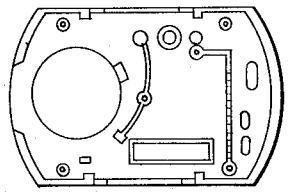
Figure 26:
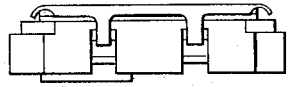

The appearance of this wristwatch module 169 from the various directions indicated by arrows A to F in FIG. 21 are shown in FIGS. 22 to 27. Namely, FIG. 22 shows a top plan view of the wristwatch module 169 seen from the direction of arrow A of FIG. 21. FIG. 23 is a bottom plan view of the same module 169 seen from the direction of arrow B of FIG. 21. FIG. 24 is a back side view of the same module 169 seen from the direction of arrow C of FIG. 21. FIG. 25 is a left side view of the same module 169 seen from the direction of arrow D of FIG. 21. FIG. 26 is a front side view of the same module 169 seen from the direction of arrow E of FIG. 21. Finally, FIG. 27 is a right side view of the same module 169 seen from the direction of arrow F of FIG. 21.

Figure 28:
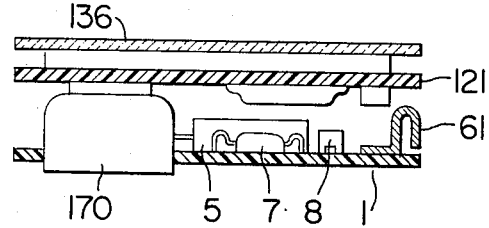
FIG. 28 is a partial cross-section of the module along line I-I' in FIG. 21.

FIG. 28 shows a cross-section of the module 169 along line I—I' of FIG. 21. It is to be noted here that the back surface of the ceramic wiring board 121 which carries no massive element is disposed to face against the LCD board 136, while the front surface thereof carrying the massive electronic components such as the boosting capacitors 118 and the LSI chip 117 is disposed to face against the printed wiring board 1 on which side space is generated by the thickness of the silver oxide battery 170. By this arrangement, the space generated by the thickness of the silver oxide battery 170 can be effectively utilized and the total thickness of the module 169 can be reduced noticeably.

Although an embodiment of the packaging has been described above, it can be altered or modified as follows.

Figure 29:
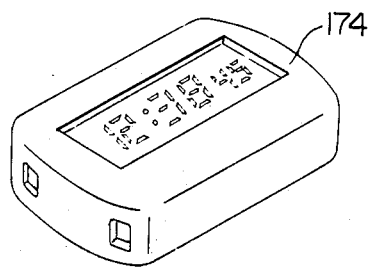
FIG. 29 is a perspective view of a module according to another embodiment of this invention.
Figure 30:
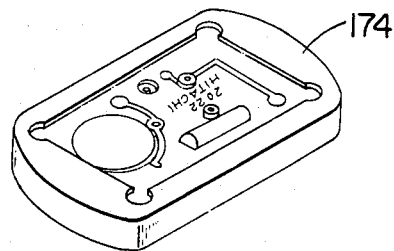
FIG. 30 is a back perspective view of the module of FIG. 29.

(a) In place of the LCD retaining frame 130, a rubber casing 174 as shown in FIG. 29 may be employed to fix the LCD board 136 by covering the whole module casing 143 loaded with the ceramic wiring board 121 and the printed wiring board 1. Here, the bottom view of the module casing 143 will become as shown in FIG. 30. The use of such a rubber casing 174 serves to absorb external shocks and hence to prevent the damage of the LCD board and the deformation of the module casing 134. It also works to afford water-proofing ability. Also the retaining frame 130 may be formed of thermoplastic resin as well as metal. When it is formed of thermoplastic resin, it never gives damage to the glass plates constituting the LCD board.

Figure 31:
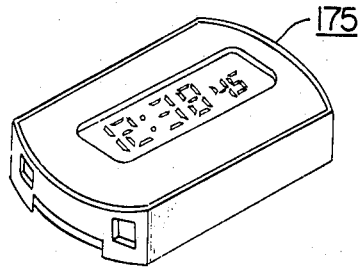
FIGS. 31 and 32 are a front and a back perspective views of a module according to another embodiment of this invention, respectively.
Figure 32:
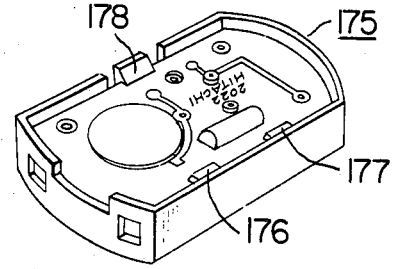
Figure 33:
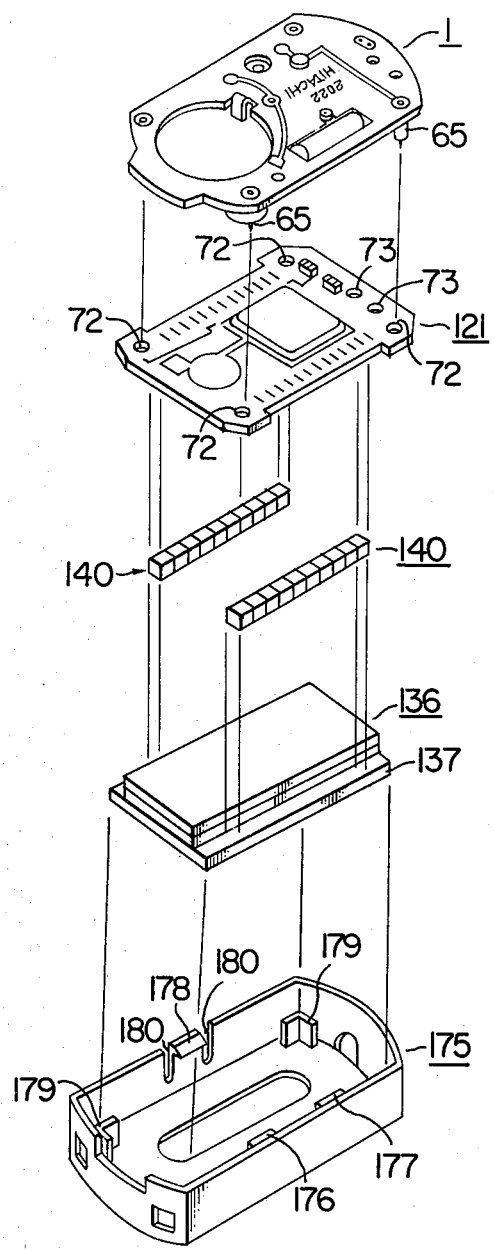
FIG. 33 is an assembly drawing of a module according to another embodiment of this invention.

(b) The retaining frame 130 may be dispensed with by loading the LCD board 136 in a module casing 175 as shown in FIGS. 31 and 32. The LCD board 136, the ceramic wiring board 121 and the printed wiring board 1 are loaded in the module casing 175 together and fixed by three stopper arms 176, 177 and 178. In this case, the packaging may be achieved as shown in FIG. 33. First, the module casing 175 is set as shown in the figure and the LCD board 136 is fitted therein to be fixed by positioning projections 179 with the display surface (upper glass plate 137) directed downward. Then, the zebra connectors 140 are placed at the terminal portions (formed of transparent electrodes and not shown in the figure) formed on the back surface of the upper glass plate 137 of the LCD 136. Then, the ceramic wiring board 121 is fitted in to be fixed by the positioning projections 179 used also for positioning the LCD board 136. Finally, the printed wiring board 1 is positioned by the use of the tapered projections of the connector pins 65 and the square connectors 64 guided into the through-holes 72 and 73 formed in the ceramic wiring board 121, and fixed by the three-stopper arms 176, 177 and 178 attached to the module casing 175. Alternatively, the ceramic wiring board 121 and the printed wiring board 1 may be preliminarily assembled and then the assembly may be mounted in the module casing 175. Although cut-away portions 180 are provided beside the stopper arm 178 formed in the module casing 175 for facilitating the expansion, they may be dispensed with. Further, the positioning projections 179 are not limited to those shown in the figures, but may be modified in various shapes.

According to this method, the number of constituent parts of the module is reduced by one and also the thickness of the completed module is also reduced by the thickness of the retaining frame 130. Further, there may be provided another advantage as follows. According to the previous module structure 169, when the module 169 is loaded in the outer casing of a wristwatch, a design plate should first be disposed on the retaining frame 130 and then an armor glass should be placed thereon. When the module casing 175 of this embodiment is provided with an appropriate coloring however, the design plate may not be used but an armor glass may be placed directly on the display surface and the module may be loaded in an outer casing.

(c) According to the preceding embodiment (b), the operation test of the circuit cannot be achieved in the state where the ceramic wiring board 121 and the printed wiring board 1 are mounted in the module casing 175 but the LCD board 136 is not. According to the following embodiment, the operation test of the circuit is enabled very easily.

The assembly drawing of FIG. 34 illustrates this embodiment. In the figure, square pillars 183 are provided in the module casing 182 for positioning and fixing the printed wiring board 1 and the ceramic wiring board 121. Stopper arms 184 are provided at a height substantially equal to that of the loaded ceramic wiring board 121 and the loaded printed wiring board 1. Further, positioning projections 185 are provided for perfectly fixing an LCD board 302.

First, the printed wiring board 1 is mounted in the module casing. Then, the ceramic wiring board 121 is mounted on the printed wiring board 1. Here, the printed wiring board 1 and the ceramic wiring board 121 are perfectly fixed by the stopper arms 184 of the square pillars 183 provided in the module casing 182, and can be hardly disengaged by the shocks of usual magnitude. The arms 184 fix the projections of the ceramic board having the through-holes 72 and 73.

The operation of the circuits on the printed wiring board 1 and the ceramic wiring board 121 provided with the required circuit components is tested in the state that the wiring boards 1 and 121 are mounted in the module casing 182.

When the operation of the circuits is normal, zebra connectors 140 are placed on the ceramic wiring board 121 in the module casing 182 at the positions corresponding to the terminals 160.

Finally, an LCD board 136 is pushed into the module casing 182 with the upper glass plate 137 directed upwards, and fixed by stopper arms 186. In this embodiment also, the positioning means provided in the module casing is not limited to that shown in the figure and described above but can be arbitrarily modified or altered.

As is apparent from the above, according to this embodiment the number of constituent parts is reduced and yet the operation test of the circuit in the way of the assembly can be achieved very easily. It will be apparent that according to the packaging method illustrated in FIG. 17 the number of constituent parts increases but the operation test of the circuit components loaded in the module casing can be carried out. In other words, the operation test of the constituent parts can be made in the state when the circuit components are loaded in the module casing provided that the LCD board is mounted in the final stage.

(d) The module structure according to this invention varies the appearance according to whether an LCD retaining frame or a rubber member is mounted on the module casing or not. However, the basic appearance of the module is as shown in FIGS. 35 to 40. By the use of such a module structure, wristwatches of various outer casings as described below will be obtained. In the figures, FIG. 35 is a top plan view, FIG. 36 is a bottom plan view, FIG. 37 is a front side view, FIG. 38 is a left side view, FIG. 39 is a right side view and FIG. 40 is a back side view.

The ceramic wiring board, the printed wiring board and the LCD board are assembled in a module casing as described above. Thereafter, a cover glass plate 192 is placed on one principal surface of the module casing as shown in FIG. 41 and the assembly is loaded in an outer casing 191 having a rectangular shape. The structure of the outer casing 191 is shown in FIGS. 41 to 46.

FIG. 41 shows a top plan view of the body of a timepiece 190. The cover glass plate 192 is fitted in one principal surface of the outer casing 191. Numeral 193 indicates the display surface of the LCD board and 194 a design plate disposed between the glass plate 192 and the display board 193. The design plate 194 is formed of a stainless plate frame of a predetermined shape and plated with nickel. Instead of using a separate design plate, a corresponding function may be afforded with by directly plating or coating a predetermined pattern on the glass plate or the LCD surface.

The manufacturer name, etc. are printed in an upper portion of the design plate 194. A wristwatch belt (not shown) will be connected to projecting portions 195. A front side view, a back side view, a right side view, a left side view and a bottom view of the watch body are shown in FIGS. 42, 43, 44 and 45, respectively.

A reset switch for seconds-display 196 is provided in the left side of the body. The display of seconds is reset to zero by depressing this switch. This switch may be depressed hearing time signal to obtain the correct seconds-display. Another switch 197 in the left side adjust the display of hours, minutes, seconds, months and dates. When this switch is pushed once, the seconds display keeps flashing (on-off). When the switch 196 is pushed in this state, the seconds-display can be adjusted. Further, when the switch 197 is pushed again (for the second time), the minutes-display keeps flashing. The minutes-display can be adjusted by pushing the switch 196 in this state. A switch 198 for exchanging the display of time and date is disposed in the right side of the watch body. When this switch is pushed, the date is displayed for one to two minutes and thereafter the display is automatically returned to the time display. When one wishes to immediately recover the time display, the switch 198 may be pushed again to recover the time display.

Figure 47:
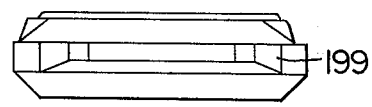
FIGS. 47 to 49 are an upper side view, a front plan view and a lower side view of a wristwatch body according to another embodiment of this invention, respectively.
Figure 48:
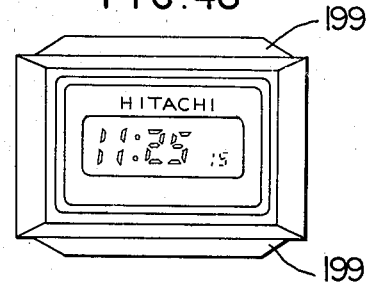
Figure 49:
Figure 50:
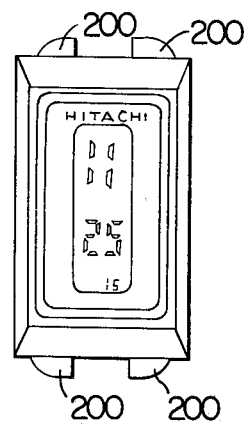
FIGS. 50 and 51 are, respectively front plan views of wristwatch bodies having a vertically long rectangular shape according to further embodiments of this invention.
Figure 51:
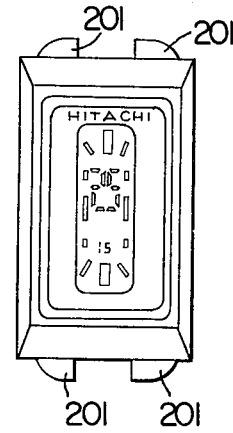
Figure 52:
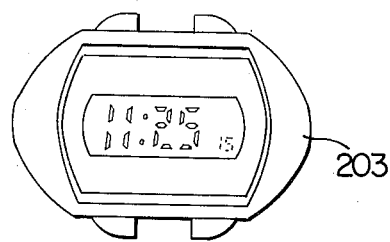
FIGS. 52 to 54 are, respectively front plan views of wristwatch bodies having elliptic, hexagonal and circular shapes according to further embodiments of this invention.
Figure 53:
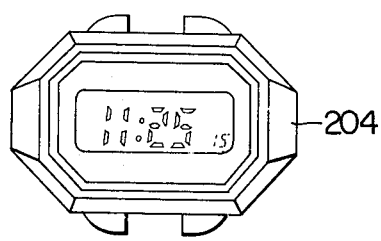
Figure 54:
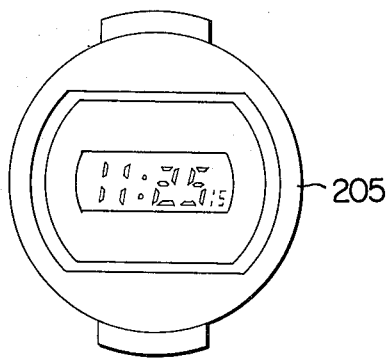

The shape of the outer casing 190 may be altered and modified in various ways. Examples are shown in FIGS. 47 to 54. FIGS. 47, 48 and 49 show an example in which the portions for connecting a watch left (leather or metal, not shown) are formed in U and inverted U-shape as shown at 199 in the figures. FIGS. 50 and 51 show another example in which the vertical length of the watch body 202 is made longer than the transverse length. In this case, the display of hours, minutes and seconds may be arranged to lie vertically as shown in FIGS. 50 and 51. The connectors for a watch left may be formed as shown at 200 and 201. Similarly, the outer casing may be shaped elliptic (203 in FIG. 52), octagonal (204 in FIG. 53) or circular (205 in FIG. 54).

The manner of time display may also be modified in various ways. FIGS. 55 to 62 show such modifications.

Figure 55:
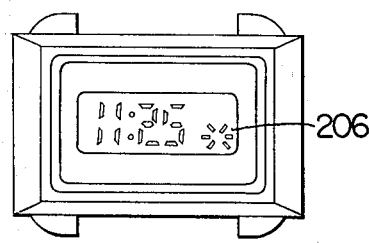
FIGS. 55 and 56 are, respectively a front plan view and a partial enlargement of a display board of a wristwatch according to another embodiment of this invention.
Figure 56:
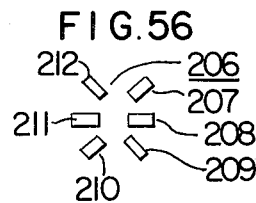
Figure 57:
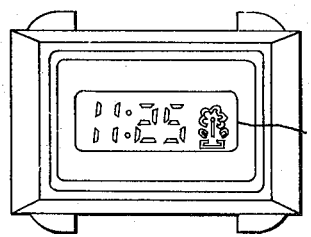
FIGS. 57 and 58 are, respectively a front plan view and a partial enlargement of a display board of a wristwatch according to another embodiment of this invention.
Figure 58:
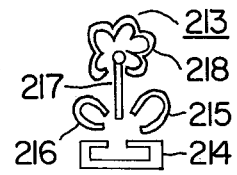

A modified display of seconds is shown in FIGS. 55 and 56, in which FIG. 55 shows a total appearance of the watch body and FIG. 56 shows an enlarged view of the seconds-display. The seconds-display 206 consists of radially disposed six segments 207 to 212. The display 206 displays seconds by lighting the segments successively in the clockwise direction in the unit of every ten seconds. Namely, the six segments are successively lighted clockwise in the unit of ten seconds. In a modified form, for the first ten seconds, the segment 207 is arranged to be flashing. For the succeeding ten seconds, the segment 207 is kept lighted on and the segment 208 is flashing. For the next ten seconds, the segments 207 and 208 are lighted continuously and the segment 209 is flashing. In this way, the segments are flashed and lighted successively in the clockwise direction. Another modification is shown in FIGS. 57 and 58, in which a flower design 213 is formed of five segments 214 to 218. According to this structure, the five segments are lighted successively, one per one second, to complete the flower display once in five seconds. Namely, for the first one second, only the segment 214 is lighted. This segment 214 is continuously lighted and the segment 215 is additionally lighted for the following one second. Then, the segment 216 is lighted on with the segments 214 and 215 being continuously lighted on for the next one second. Similarly, the segments 217 and 218 are successively lighted to light the whole segments of the flower design in five seconds. In the sixth second, the segments 215 and 218 are turned off to leave only the segment 214 being turned on. In the seventh second, the segment 215 is additionally turned on similar to the above-described operation. The number of the lighted segments increases one by one at each succeeding second and all the segments of the flower design are lighted in the tenth second. Namely, the seconds-display 213 of the flower design is totally lighted at even fifth second. Such a seconds-display by a designed pattern is visually amusing compared to the numerical display and is effective in fashion watches and watches for children.

Figure 59:
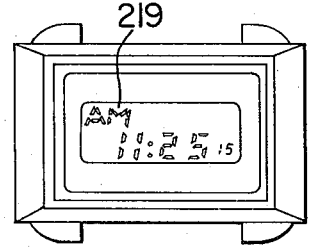
FIGS. 59 to 62 are front plan views of the display boards of a wristwatch according to further embodiments of this invention.

In the example of FIG. 59, the display 219 of AM or PM is provided in a left upper portion of the display board for clarifying whether it is before or after noon. This apparently clarifies whether it is before or after noon and further serves to set the correct time in the watch capable of displaying the date.

Figure 60:
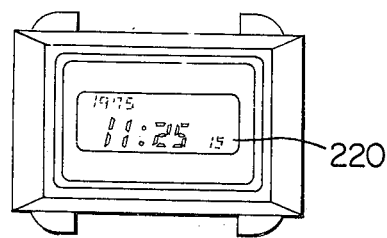
Figure 61:
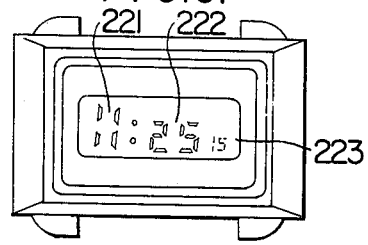
Figure 62:
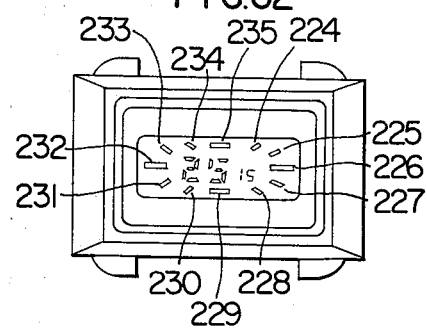

In the example of FIG. 60, the year is displayed in a left upper portion as indicated at 220 in the figure. Further, as shown in FIG. 61, the size of the display of hours' 221, minutes' 222 and seconds' 223 may be graded. According to such a graded display, the discrimination of the digits displaying hours, minutes and seconds can be instantaneously done by the size of the digits to enhance the recognizability. Alternatively, twelve segments 224 to 235 may be provided in the peripheral portion of the display surface at equally divided angles to perform the display of hours with those segments as shown in FIG. 62. The display of FIG. 62 represents the time of 11 hours 25 minutes 15 seconds. The display of "11 hours" is achieved by lighting the segment 234 as shown in the figure. Then, the display of "25 minutes" is achieved at a central portion of the display surface and that of "15 seconds" in a lower middle-right portion. When the total shape of the wristwatch body is designed to be vertically long, a similar display mode may be achieved as shown in FIG. 51. Similarly, those display modes as shown in FIGS. 55, 57, 59, 60 and 61 may be adapted in a vertically long display surface as shown in FIGS. 50 and 51.

Description has been made on various shapes of the outer casing and on various display modes of hours, minutes and seconds, may modifications can be considered without departing from the spirit of this invention. For example, the shape of the outer casing may be designed hexagonal, square, rhomboid, etc.

As has been described above, the assembly of a watch structure can be simplified and a module adapted for various designs of the outer casing can be provided according to this invention.

What is claimed is:

1. An electronic timepiece module to be assembled in a watch case comprising:
   a first wiring board having first and second principal surfaces at opposite sides thereof, said first principal surface having electronic parts and interconnections for constituting a timepiece circuit, said second principal surface being substantially flat, and said first wiring board having a hole at a portion thereof for mounting a battery therethrough for energizing said timepiece circuit;
   a second wiring board having first and second parallel principal surfaces, said second wiring board being substantially sized to said first wiring board and being positioned spaced apart from said first wiring board so as to oppose said first principal surface thereof to said first principal surface of the first wiring board, said first principal surface of the second wiring board having a power source terminal at a portion thereof corresponding to said portion of said first wiring board for connecting said battery and an integrated circuit for said timepiece circuit, said second principal surface of the second wiring board having output wiring terminals for deriving electric output signals of said timepiece circuit, the distance between said first principal surface of the second wiring board and said second principal surface of the first wiring board being substantially equal to the thickness of said battery mounted through said hole of the first wiring board, and said second principal surface of the second wiring board being substantially flat;
   a first resilient member having first contact means located at said first principal surface of said first wiring board and second contact means located at said first principal surface of the second wiring board for electrically and elastically connecting said first wiring board to said second wiring board;
   display means for displaying the time of the timepiece including a first principal surface having a display panel for giving display and a second principal surface having input wiring terminals for receiving said electric output signals of the timepiece circuit;
   a second resilient member having first contact means located at said input wiring terminals of the display means and second contact means located at said output wiring terminals of the second wiring board to said display means; and
   assembling means for stacking said first and second wiring boards and said display means for elastically holding them together in cooperation with said first and second resilient members.

2. An electronic timepiece module according to claim 1, wherein said display means is substantially sized to said second wiring board, and wherein said first and second wiring boards and said display means having substantially the same elongated plane shape, said first wiring board having said hole for mounting the battery at said portion in a longitudinal direction thereof, and the electronic parts at another portion in longitudinal direction thereof, said first principal surface of the second wiring board having said power source terminal at said portion corresponding to said portion thereof corresponding to said another portion of the first wiring board.

3. An electronic timepiece module according to claim 1, wherein said display means is substantially sized to said second wiring board, and wherein said first and second wiring boards and said display means having substantially the same elongated plane shape, said first wiring board having said hole for mounting the battery at said portion in a longitudial direction thereof and the electronic parts at another portion in longitudinal direction thereof said first principal surface of the second wiring board having said power source terminal at said portion corresponding to said portion of the first wiring board and said integrated circuit at another portion of the first wiring board and said integrated circuit at another portion thereof corresponding to said another portion of the first wiring board.

4. An electronic timepiece module according to claim 1, wherein said assembling means includes easing means for positioning said first and second wiring boards and said display means in a predetermined positional relation, and restraining means for holding said first wiring board, said first resilient member, said second wiring board, said second resilient member and said display means which are stacked in that order in compression.

5. An electronic timepiece module according to claim 1, wherein said assembling means comprises a wall member defining an interior cavity which is occupied by said first wiring board, said first resilient member, said second wiring board, said second resilient member, and said display means which are stacked in that order, and supporting means extending from said wall member for at least partially receiving peripheral portions of the second principal surface of said first wiring board and the first principal surface of said display means.

6. An electronic timepiece module to be assembled in a watch case comprising:
   a first wiring board having first and second principal surfaces at opposite sides thereof, said first principal surface having electronic parts and interconnections for constituting a timepiece circuit, said second principal surface being substantially flat, and said first wiring board having a hole at a portion thereof for mounting a battery therethrough for energizing said timepiece circuit;

a second wiring board having first and second parallel principal surfaces, said second wiring board being substantially sized to said first wiring board and being positioned spaced apart from said first wiring board so as to oppose said first principal surface thereof to said first principal surface of the first wiring board, said first principal surface of the second wiring board having a power source terminal at a portion thereof corresponding to said portion of said first wiring board for connecting said battery and an integrated circuit for said timepiece circuit, said second principal surface of the second wiring board having output wiring terminals for deriving electric output signals of said timepiece circuit, and second second principal surface of the second wiring board being substantially flat;

a first resilient member having first contact means located at said first principal surface of said first wiring board and second contact means located at said first principal surface of the second wiring board for electrically and elastically connecting said first wiring board to said second wiring board;

display means for displaying the time of the timepiece including a first principal surface having a display panel for giving display and a second principal surface having input wiring terminals for receiving said electric output signals of the timepiece circuit;

a second resilient member having first contact means located at said input wiring terminals of the display means and second contact means located at said output wiring terminals of the second wiring board to said display means; and assembling means for stacking said first and second wiring boards and said display means for elastically holding them together in cooperation with said first and second resilient members, wherein said assembling means includes easing means for positioning said first and second wiring boards and said display means in a predetermined positional relation, and restraining means for holding said first wiring board, said first resilient member, said second wiring board, said second resilient member and said display means which are stacked in that order in compression, wherein said casing means comprises a side wall member disposed around the end portion of each of said first and second wiring boards and adjacent to at least part of each end portion thereof, and a support member extending perpendicularly from said side wall member for receiving said first wiring board, and wherein said restraining means comprises a support frame member for supporting the peripheral portion of said first principal surface of the display means and flexible arms extending from said support frame member and engaging with said side wall member.

7. In an electronic timepiece module including display means having a viewing surface for giving display and a back surface having a plurality of input wiring terminals arranged to receive electric display signals; wiring board means for constituting a timepiece circuit, said wiring board means having plural output wiring terminals arranged corresponding to said input wiring terminals, and having electronic parts for the timepiece circuit; resilient connector means for electrically and elastically connecting said output wiring terminals to said input wiring terminals, and holding means for holding said display means, said resilient connector means and said wiring board means together in compression: the improvement wherein said wiring board means comprises first and second wiring boards which are positioned spaced apart from and in parallel with each other with the substantially same shape thereof, said first and second wiring boards respectively having said electronic parts at oppositely facing sides thereof and respectively having substantially flat surfaces at the other sides thereof, said second wiring board having a power source terminals for connecting a battery at a portion of said opposite side thereof, said first wiring board having a hole for mounting therethrough said battery at a portion thereof corresponding to said portion of said second wiring board, the distance between said opposite side of the second wiring board and said other side of the first wiring board being substantially equal to the thickness of said battery mounted through said hole of the first wiring board.

8. An electronic timepiece module according to claim 7, wherein said wiring board means further comprises a second resilient member, disposed between said first and second wiring boards, for electrically and elastically connecting said first wiring board to said second wiring board.

9. An electronic timepiece module according to claim 8, wherein said second wiring board has an integrated circuit at said opposite side thereof, said integrated circuit having at least output terminals corresponding to said plural input wiring terminals of the display means, and said first wiring board has the other electronic parts at said opposite side thereof.

10. An electronic timepiece module according to claim 7, wherein said display means is substantially sized to said first and second wiring boards in the plane shape.

11. An electronic timepiece module according to claim 10, wherein said holding means comprises spring clip means adapted between said display mens and said wiring board means.

* * * * *